(12) United States Patent
Chou et al.

(10) Patent No.: US 12,453,144 B2
(45) Date of Patent: Oct. 21, 2025

(54) SEMICONDUCTOR DEVICE COMPRISING FIRST ETCH STOP LAYER OVER FIRST CONDUCTIVE FEATURE OVER SOURCE/DRAIN REGION

(71) Applicant: Taiwan Semiconductor Manufacturing Co., Ltd., Hsinchu (TW)

(72) Inventors: Pei-Yu Chou, Hsinchu (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 664 days.

(21) Appl. No.: 17/699,430

(22) Filed: Mar. 21, 2022

(65) Prior Publication Data

US 2023/0299136 A1     Sep. 21, 2023

(51) Int. Cl.
*H10D 62/10* (2025.01)
*H10D 30/67* (2025.01)
(Continued)

(52) U.S. Cl.
CPC ....... *H10D 62/118* (2025.01); *H10D 30/6713* (2025.01); *H10D 30/6729* (2025.01);
(Continued)

(58) Field of Classification Search
CPC ......... H01L 29/0665; H01L 21/823412; H01L 21/823418; H01L 21/823468; H01L 29/41733; H01L 29/42392; H01L 29/6656; H01L 29/78618; H01L 29/78696; H01L 29/41775; H01L 21/76804; H01L 21/76831; H01L 21/76832; H01L 21/76834; H01L 21/76895; H01L 21/76897; H01L 27/088; H01L 29/0673; H01L 29/775; H01L 21/28518;
(Continued)

(56) References Cited

U.S. PATENT DOCUMENTS 9,105,490 B2   8/2015   Wang et al.
9,236,267 B2   1/2016   De et al.
(Continued)

FOREIGN PATENT DOCUMENTS

TW      202211334 A     3/2022

OTHER PUBLICATIONS

A. Heryanto et al., "Effect of Copper TSV Annealing on Via Protrusion for TSV Wafer Fabrication" Journal of Electronic Materials, vol. 41, No. 9. Sep. 2012, pp. 2533-2542.

*Primary Examiner* — Davienne N Monbleau
*Assistant Examiner* — John Patrick Cornely
(74) *Attorney, Agent, or Firm* — Slater Matsil, LLP

(57) ABSTRACT

A semiconductor device including an etch stop layer and a method of forming is provided. The semiconductor device may include a source/drain region and a gate structure, wherein a first etch stop layer is over a conductive plug to a source/drain region and a second etch stop layer is over the gate structure. The first etch stop layer and the second etch stop layer may have different thicknesses. A dielectric layer may be formed over the first etch stop layer and the second etch stop layer, and contacts may be formed through the dielectric layer and the first and second etch stop layers.

20 Claims, 34 Drawing Sheets

(51) Int. Cl.
*H10D 64/01* (2025.01)
*H10D 84/01* (2025.01)
*H10D 84/03* (2025.01)

(52) U.S. Cl.
CPC ..... *H10D 30/6735* (2025.01); *H10D 30/6757* (2025.01); *H10D 64/021* (2025.01); *H10D 84/0128* (2025.01); *H10D 84/013* (2025.01); *H10D 84/0147* (2025.01); *H10D 84/038* (2025.01)

(58) Field of Classification Search
CPC ............... H01L 29/165; H01L 29/7848; H01L 27/0886; H01L 21/823431; H01L 21/823475; H01L 29/66439; H01L 29/66545; H01L 23/5386; H01L 21/76829; B82Y 10/00; H10D 64/021; H10D 84/0147; H10D 84/0149
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 11,575,014 B2 | 2/2023 | Bae et al. |
| 2021/0202744 A1 | 7/2021 | You et al. |
| 2021/0375677 A1* | 12/2021 | Wang .................. H01L 27/0924 |

* cited by examiner

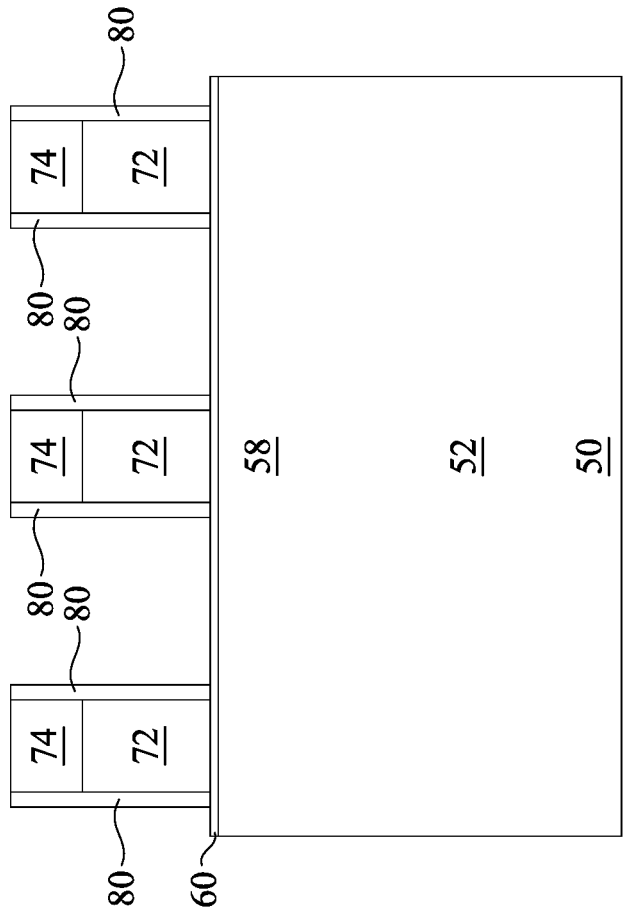
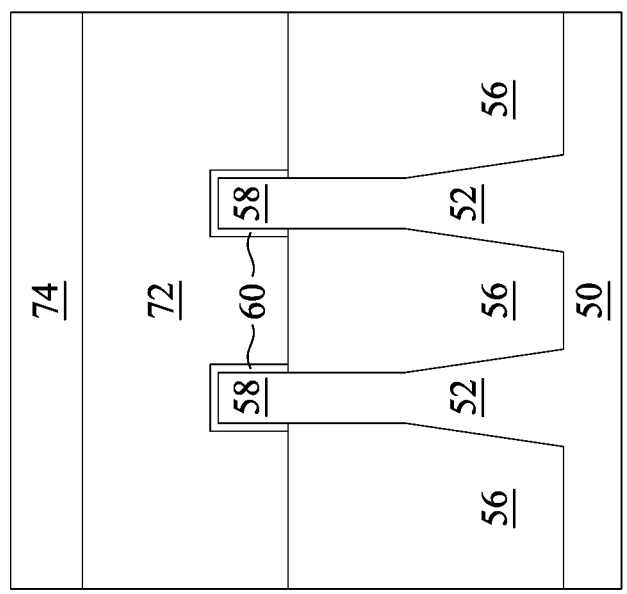
Fig. 8B
Fig. 8A

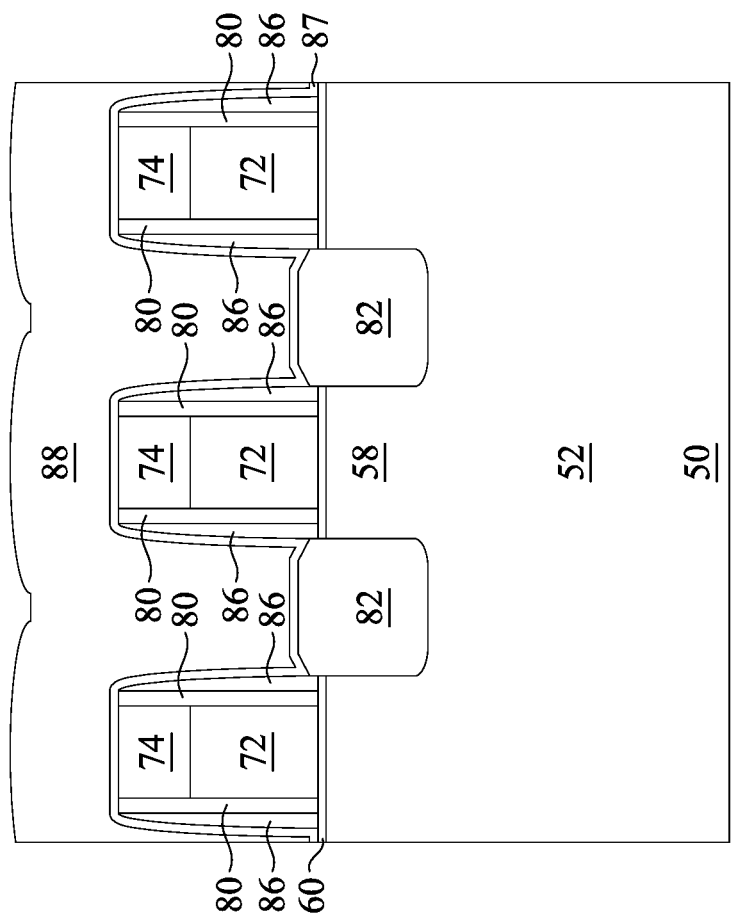
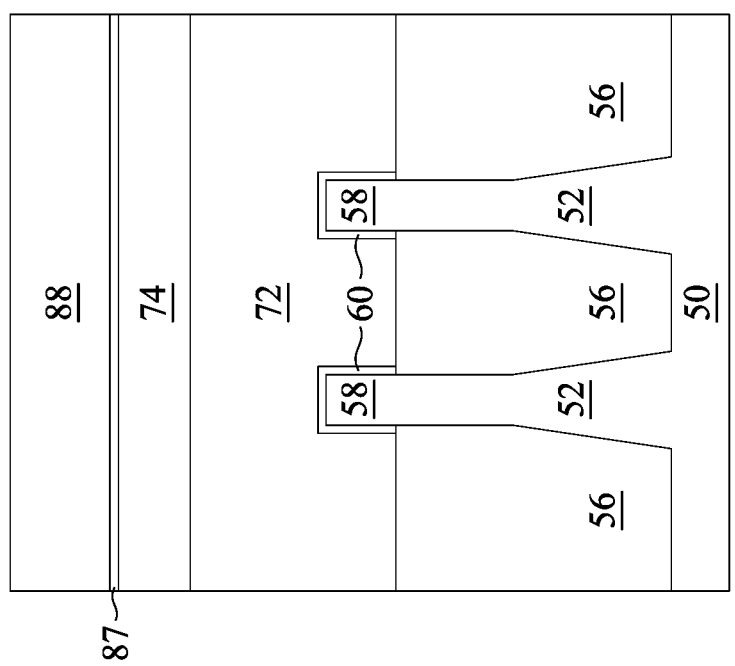
Fig. 11B
Fig. 11A

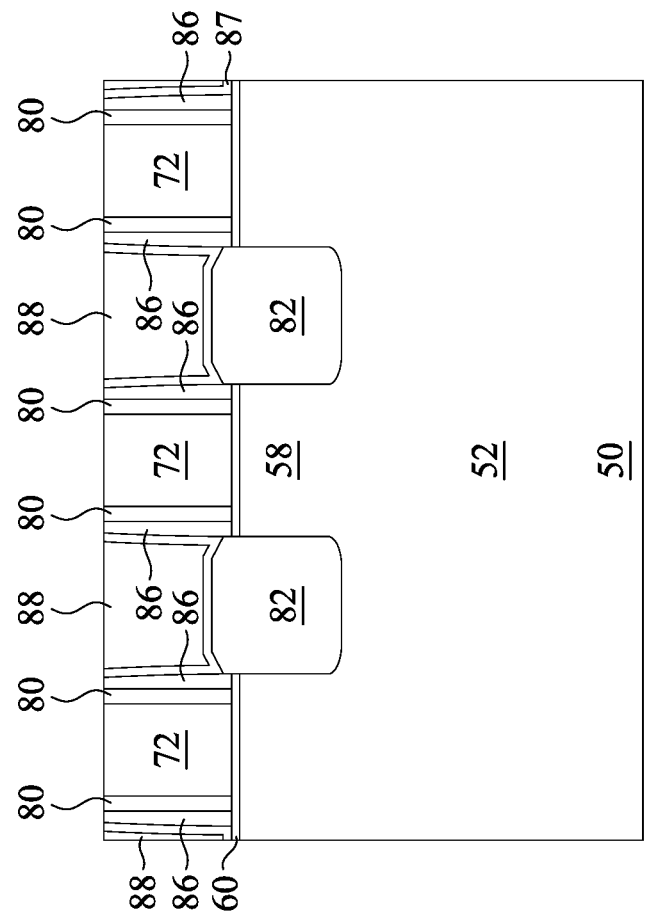
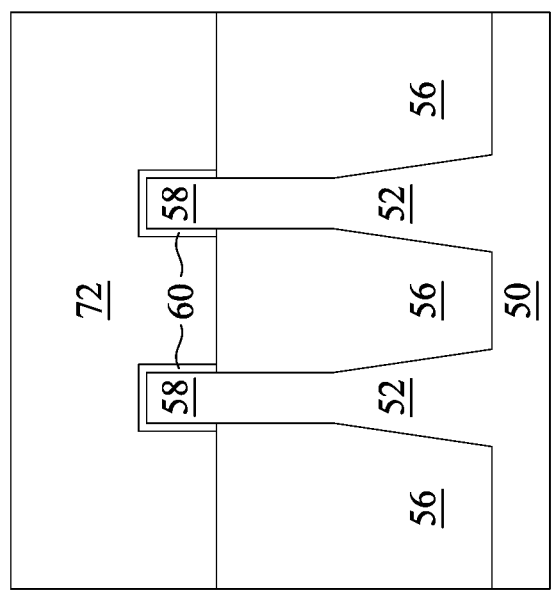
Fig. 12B
Fig. 12A

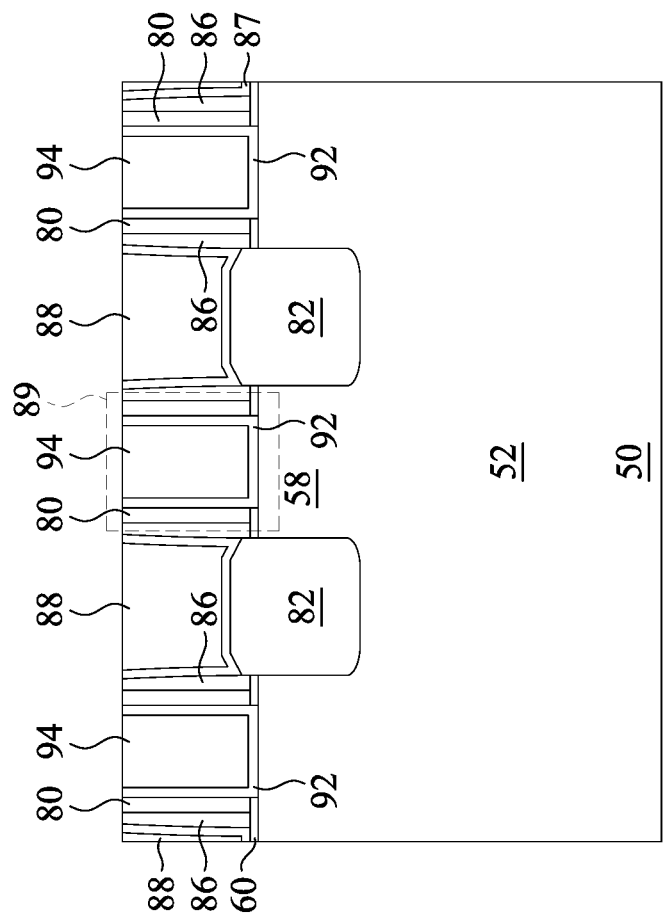
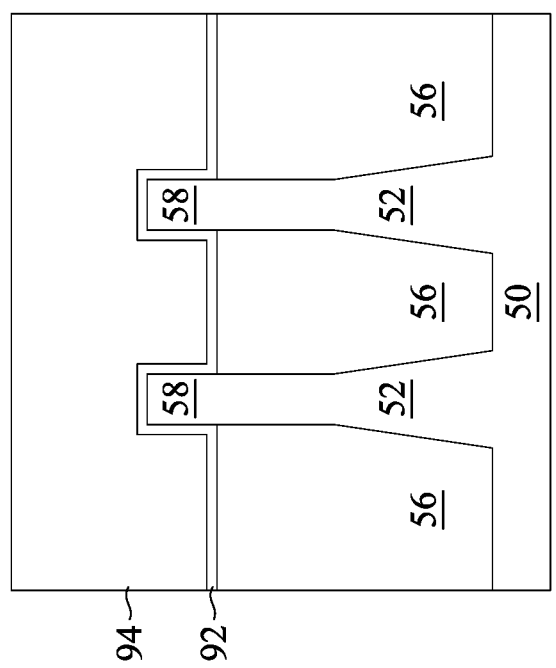
Fig. 14B
Fig. 14A

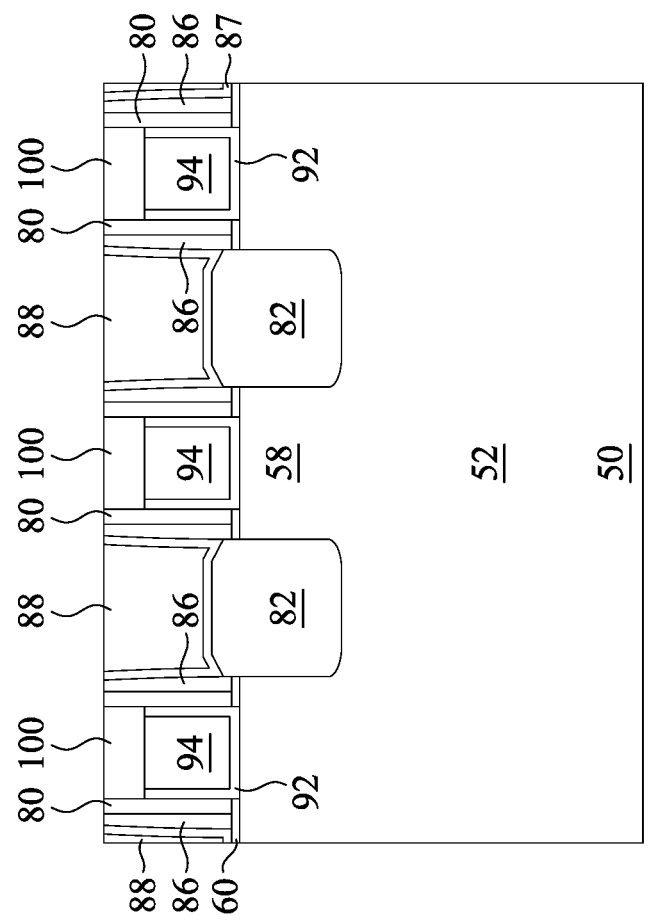
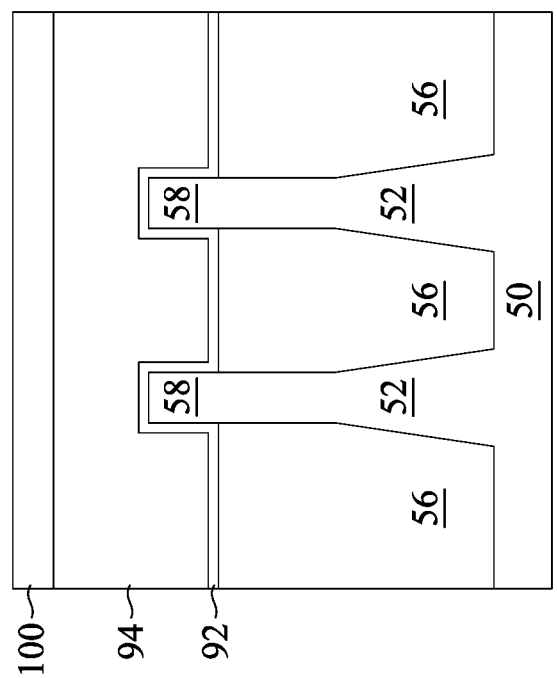
Fig. 15B
Fig. 15A

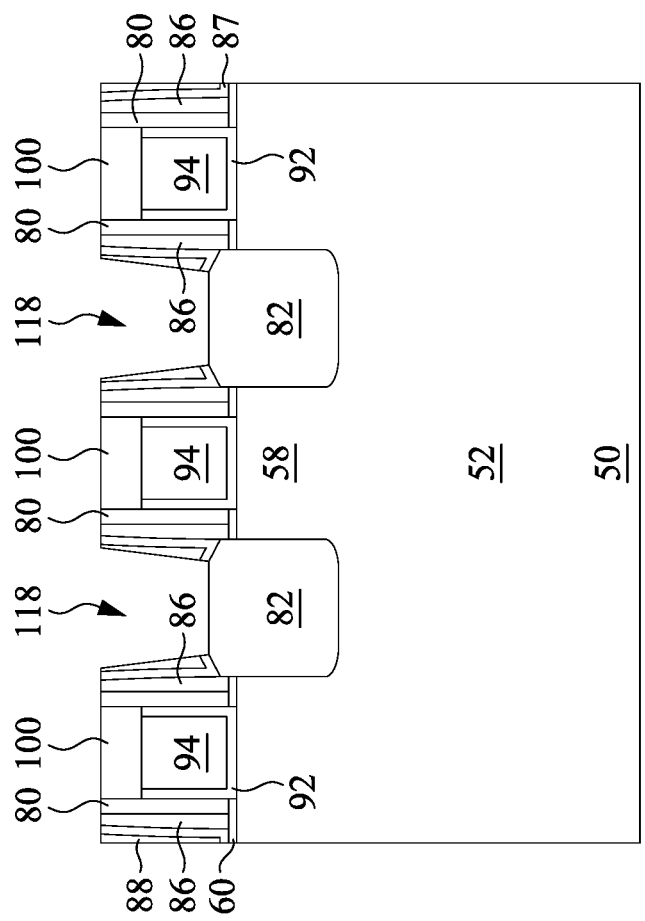
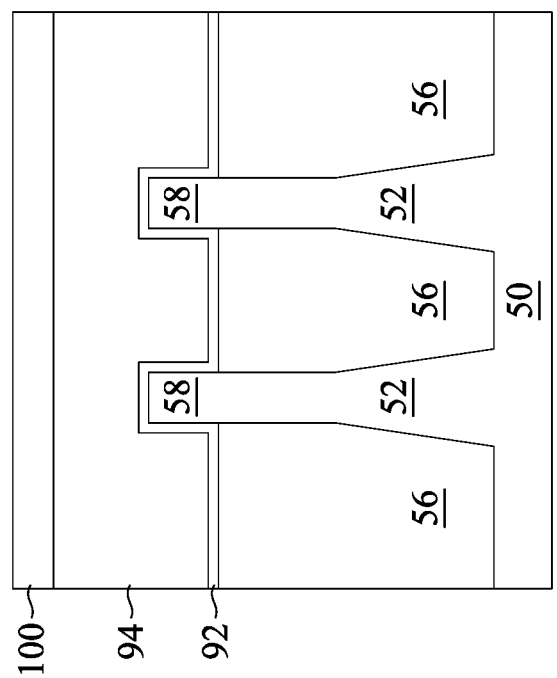
Fig. 16B
Fig. 16A

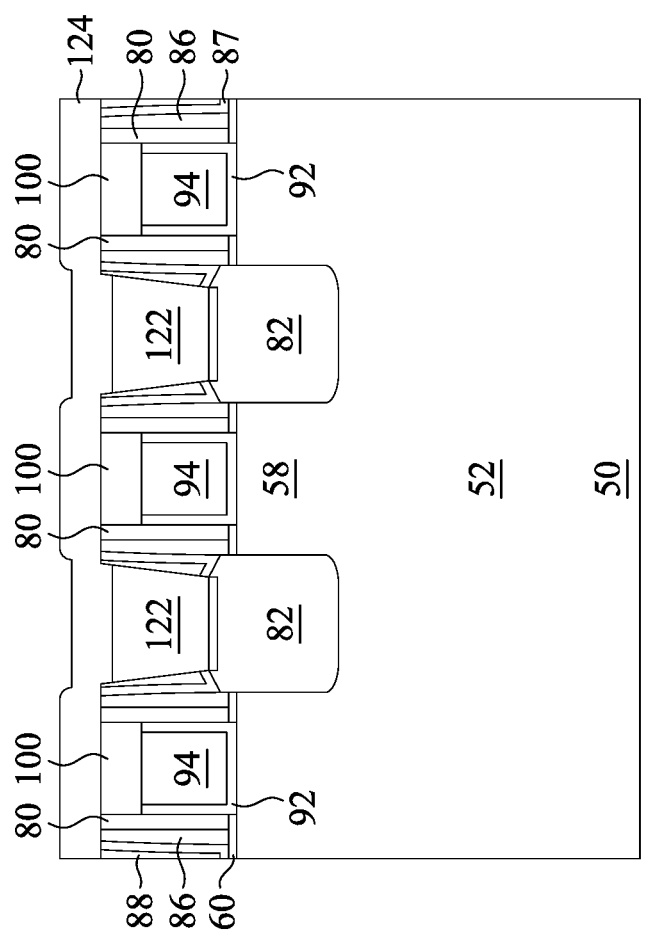
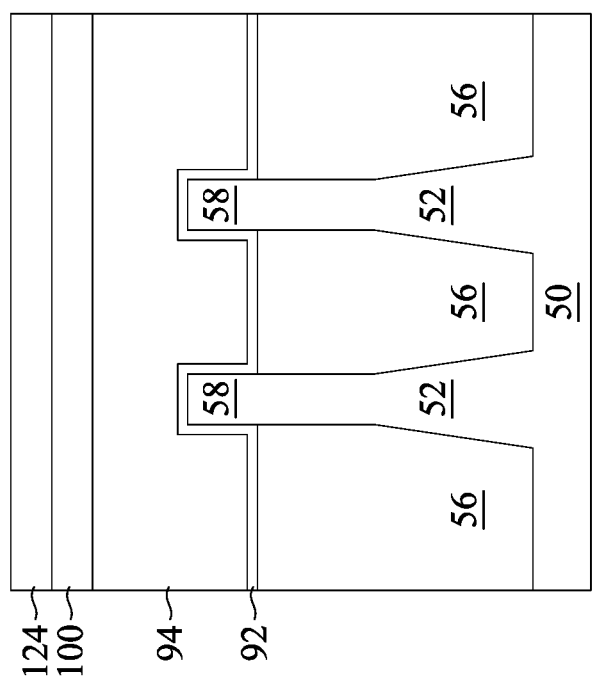
Fig. 19B
Fig. 19A

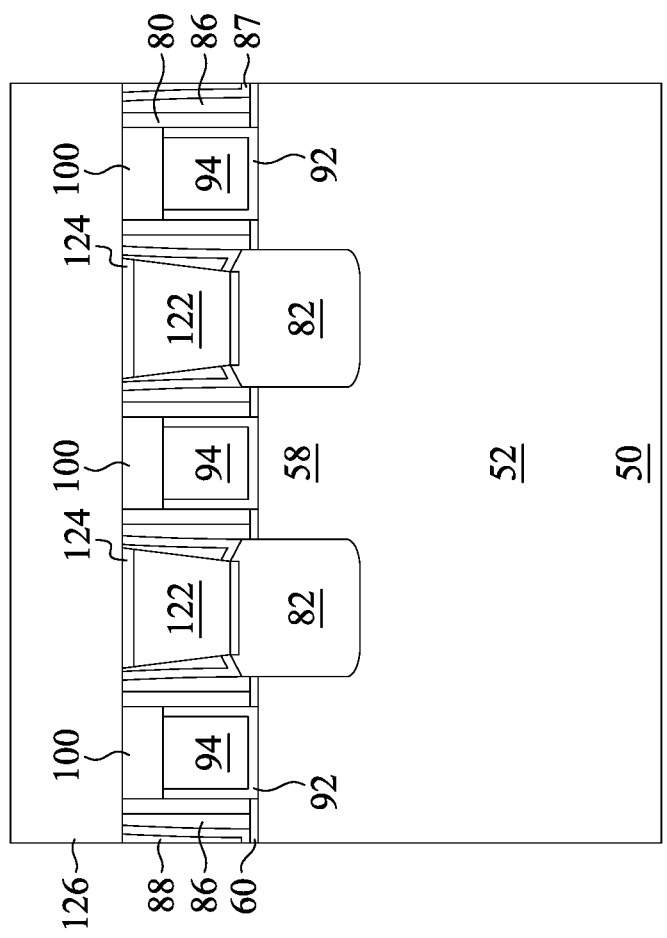
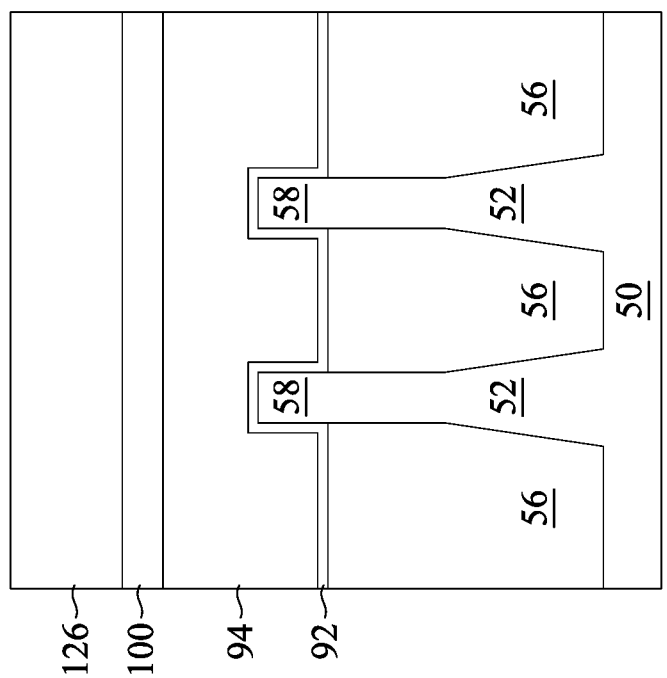
Fig. 21B
Fig. 21A

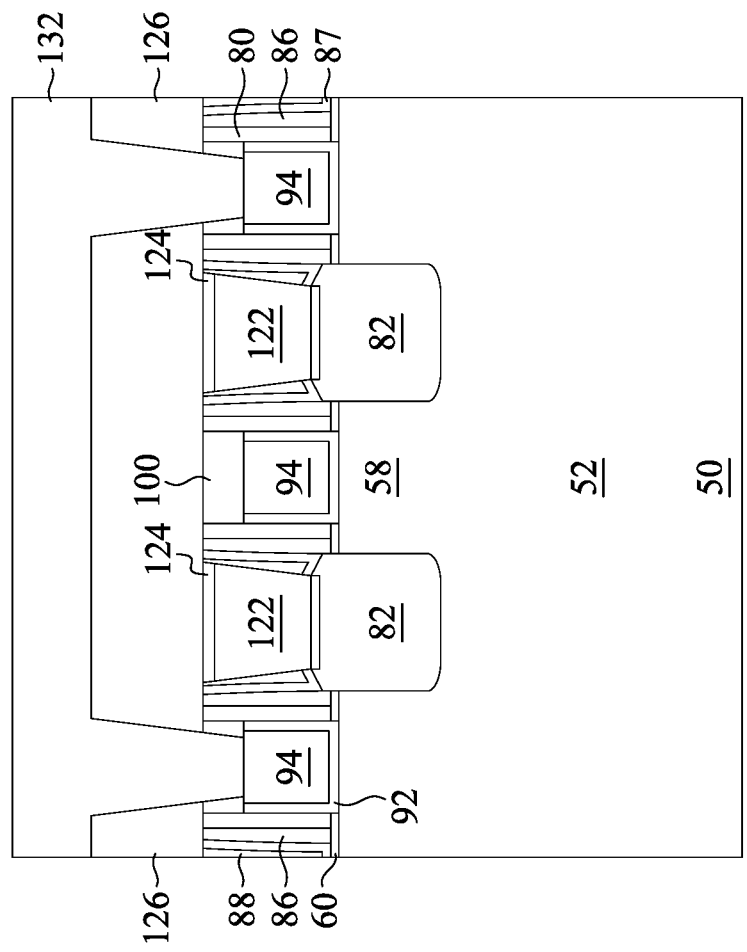
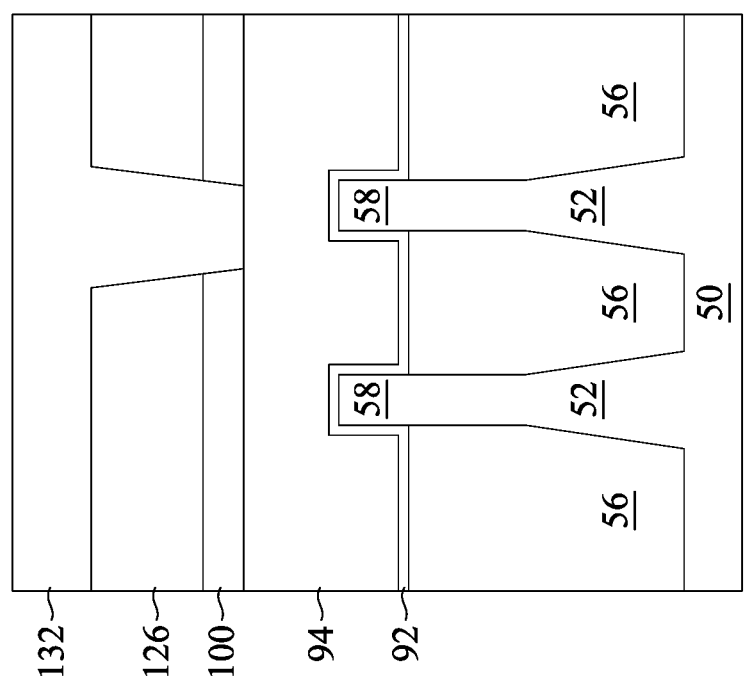
Fig. 23B
Fig. 23A

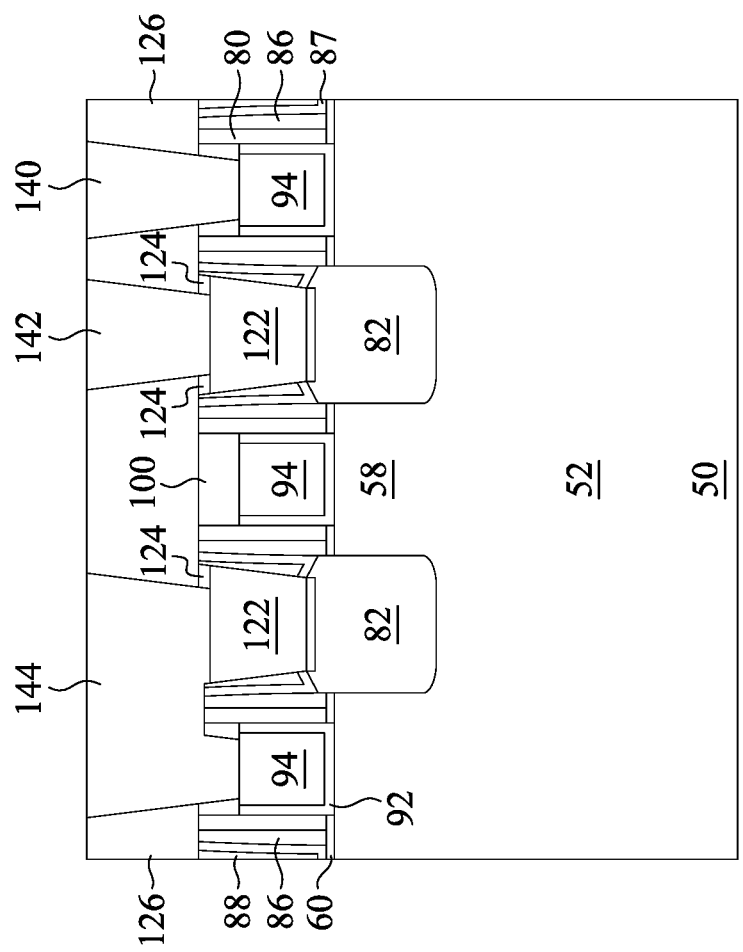
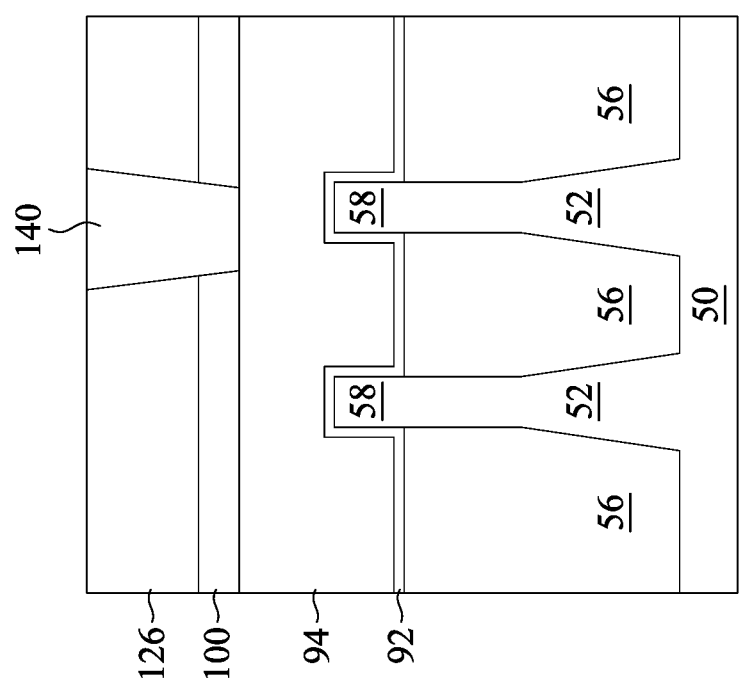
Fig. 26B
Fig. 26A

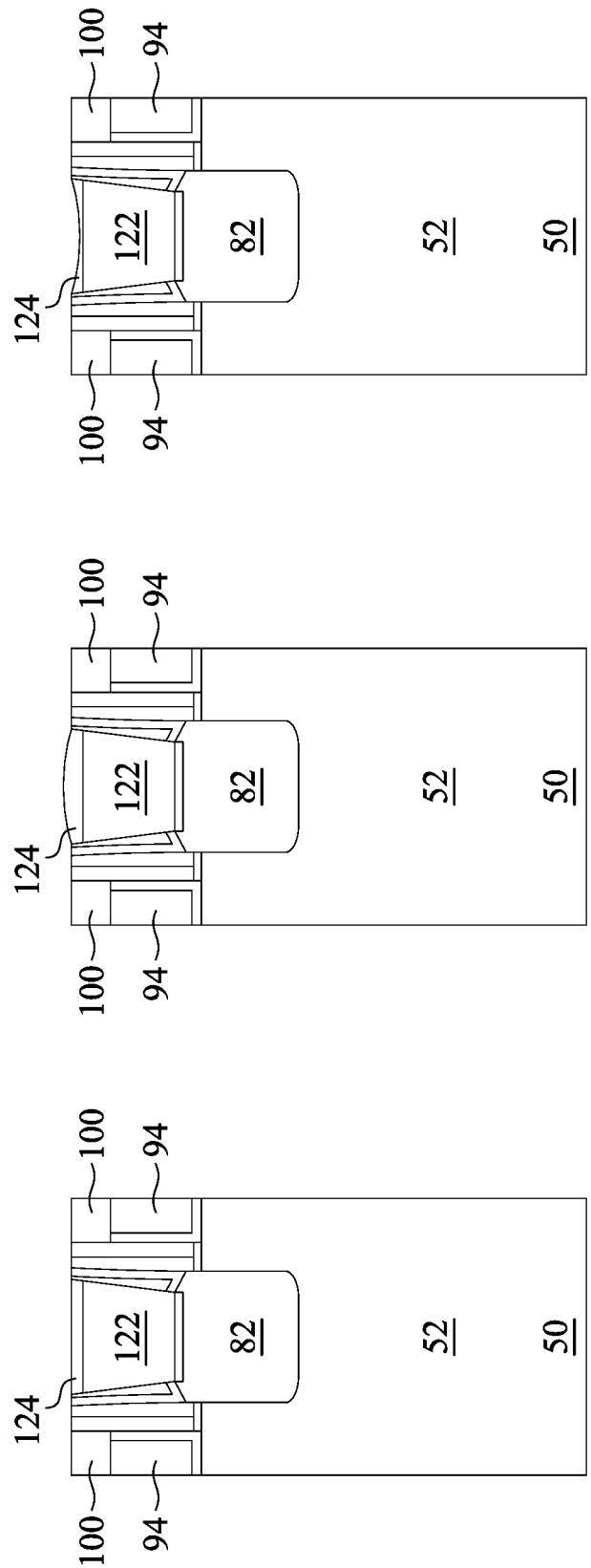

SEMICONDUCTOR DEVICE COMPRISING FIRST ETCH STOP LAYER OVER FIRST CONDUCTIVE FEATURE OVER SOURCE/DRAIN REGION

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 22A, 22B, 23A, 23B, 24A, 24B, 25A, 25B, 26A, 26B, 27A, 27B, 29A, 29B, 29C, 30A, 30B, 30C, 31A, 31B, 31C, 32A, 32B, and 32C are cross-sectional views of intermediate stages in the manufacturing of FinFET devices, in accordance with some embodiments.

DETAILED DESCRIPTION

Figure 1:
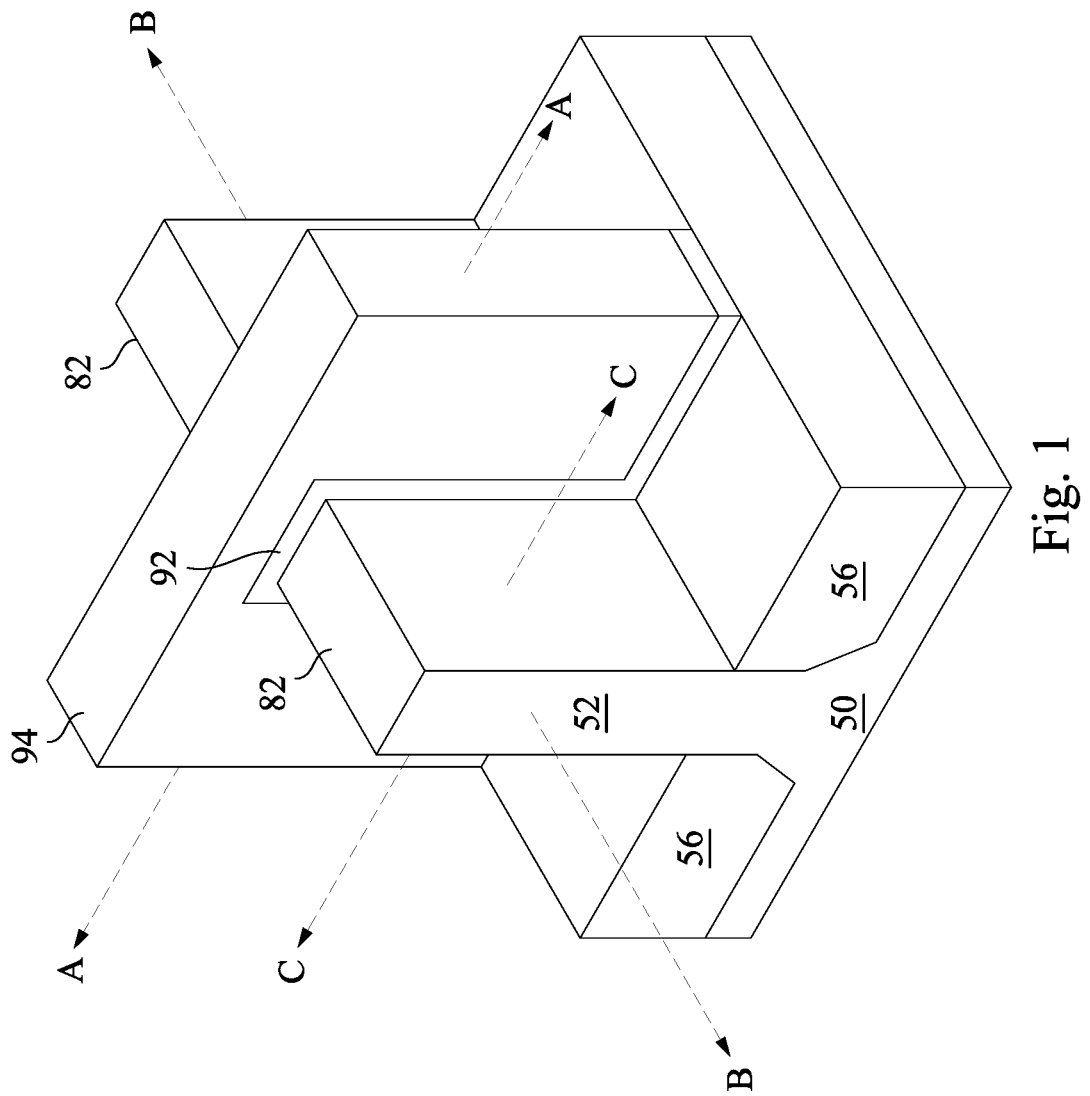
FIG. 1 illustrates an example of a Fin Field-Effect Transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a contact plug structure of a semiconductor device and a method of forming the same. Various embodiments presented herein are discussed in the context of a Fin Field Effect Transistor (FinFET) device formed using a gate-last process. In other embodiments, a gate-first process may be used. Various embodiments may be applied, however, to devices comprising other types of transistors such as planar FETs, nanostructure (e.g., nanosheet, nanowire, gate-all-around (GAA), or the like) field effect transistors (NFETs/NSFETs), or the like in lieu of or in combination with the FinFETs. In some embodiments, etch stop layers are formed within the recesses of the contact plugs of a semiconductor device and used during subsequent processing steps, such as forming conductive features on the contact plugs. By forming the etch stop layers within recesses, the overall thickness of the device can be reduced which leads to better profiles of conductive features over the gate stacks, source/drain regions, or the like, thereby improving electrical connections in the device.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

FIGS. 2 through 27B are cross-sectional views of intermediate stages in the manufacturing of FinFET devices, in accordance with some embodiments. FIGS. 2, 3, 4, 5, 6, 7, 8A, 9A, 10A, 11A, 12A, 13A, 14A, 15A, 16A, 17A, 18A, 19A, 20A, 21A, 22A, 23A, 24A, 25A, 26A, 27A are illustrated along reference cross-section A-A illustrated in FIG. 1, wherein the cross-sectional views illustrate multiple fins/FinFETs for illustrative purposes. FIGS. 8B, 9B, 10B, 11B, 12B, 13B, 14B, 14C, 15B, 16B, 17B, 18B, 19B, 20B, 21B, 22B, 23B, 24B, 25B, 26B, and 27B are illustrated along reference cross-section B-B illustrated in FIG. 1, wherein the cross-sectional views illustrate multiple fins/FinFETs for illustrative purposes. FIGS. 10C and 10D are illustrated along reference cross-section C-C illustrated in FIG. 1, wherein the cross-sectional views illustrate multiple fins/FinFETs for illustrative purposes.

Figure 2:
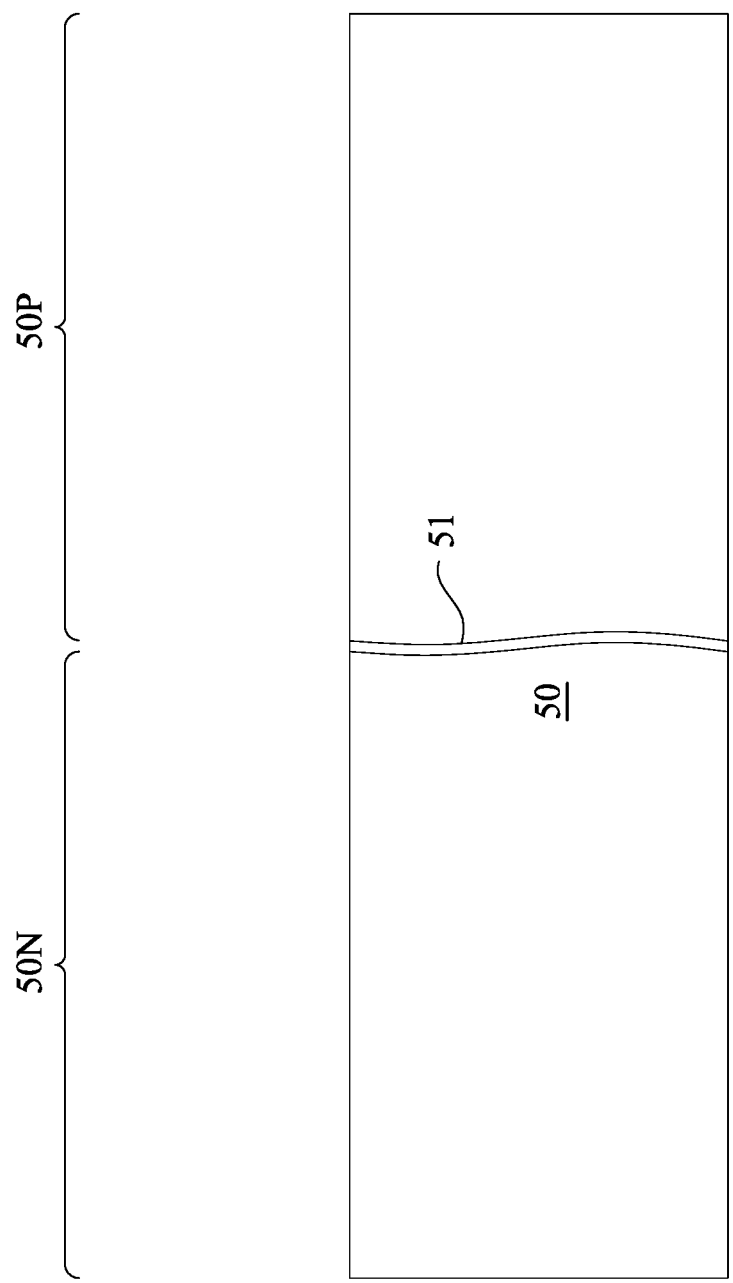

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; the like; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
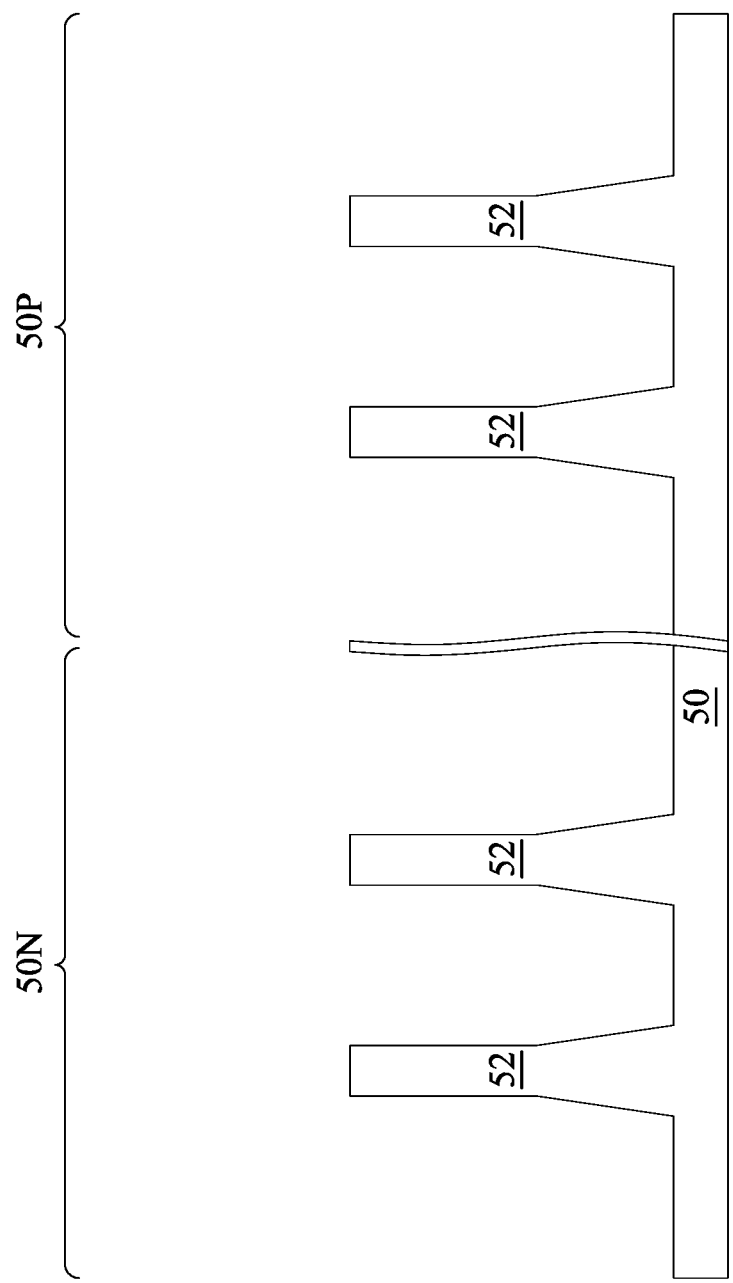

In FIG. 3, fins 52 are formed in the substrate 50, in accordance with some embodiments. The fins 52 are semiconductor strips. In some embodiments, the fins 52 may be formed in the substrate 50 by etching trenches in the substrate 50. The etching may be any acceptable etch process, such as a reactive ion etching (RIE), neutral beam etching (NBE), the like, or a combination thereof. The etching may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins 52. In some embodiments, the mask (or other layer) may remain on the fins 52.

Figure 4:
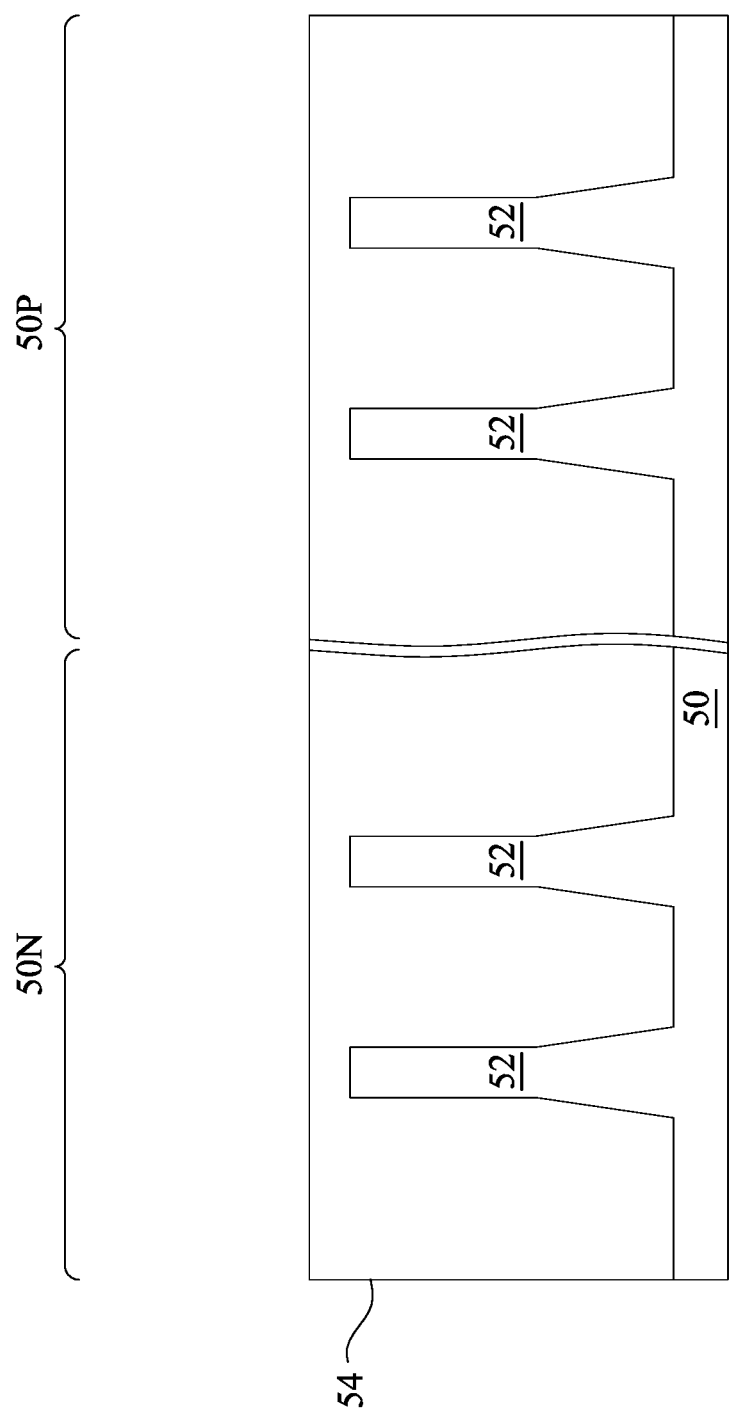

In FIG. 4, an insulation material 54 is formed over the substrate 50 and between neighboring fins 52, in accordance with some embodiments. The insulation material 54 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An annealing process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along surfaces of the substrate 50 and the fins 52. Thereafter, a fill material such as those discussed above may be formed over the liner.

Figure 5:
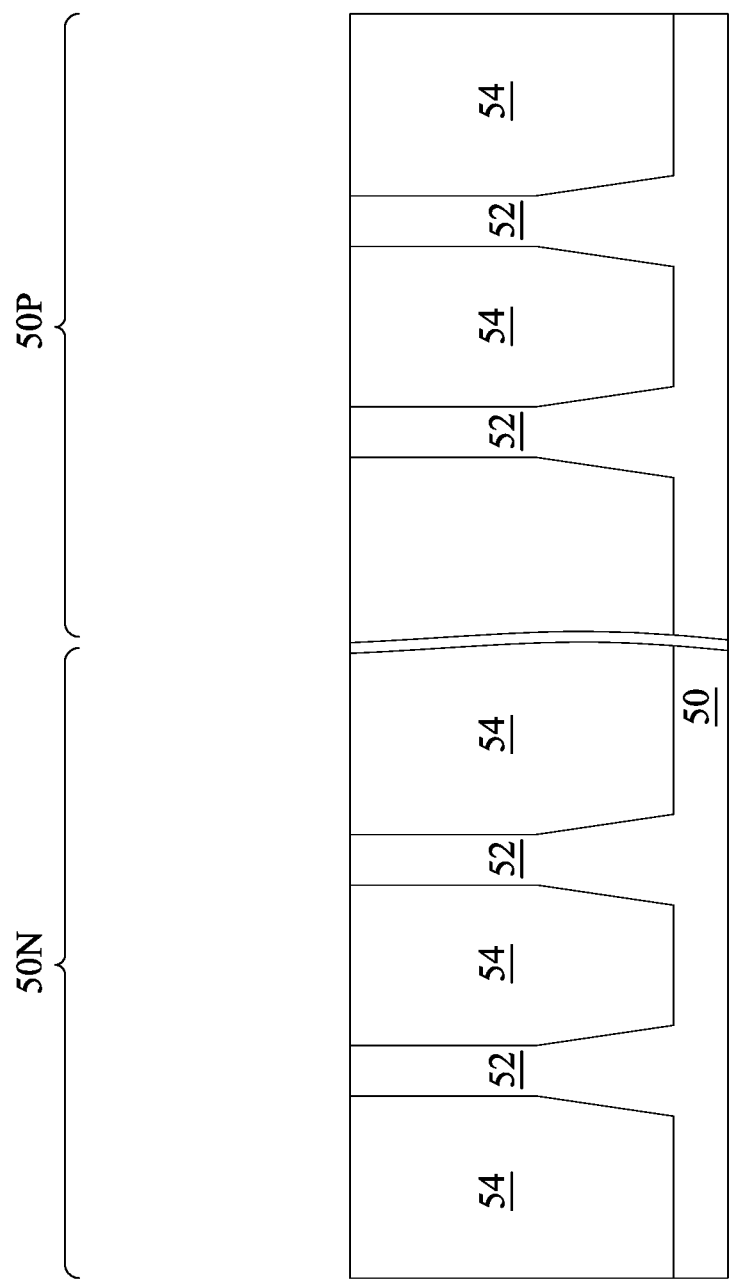

In FIG. 5, a removal process is applied to the insulation material 54 to remove excess insulation material 54 over the fins 52. In some embodiments, a planarization process such as a chemical mechanical polish (CMP), an etch-back process, a combination thereof, or the like may be utilized. The planarization process exposes the fins 52 such that top surfaces of the fins 52 and the insulation material 54 are substantially coplanar or level (e.g., within process variations of the planarization process) after the planarization process is completed. In embodiments in which a mask remains on the fins 52, the planarization process may expose the mask or remove the mask such that top surfaces of the mask or the fins 52, respectively, and the insulation material 54 are level after the planarization process is completed.

Figure 6:
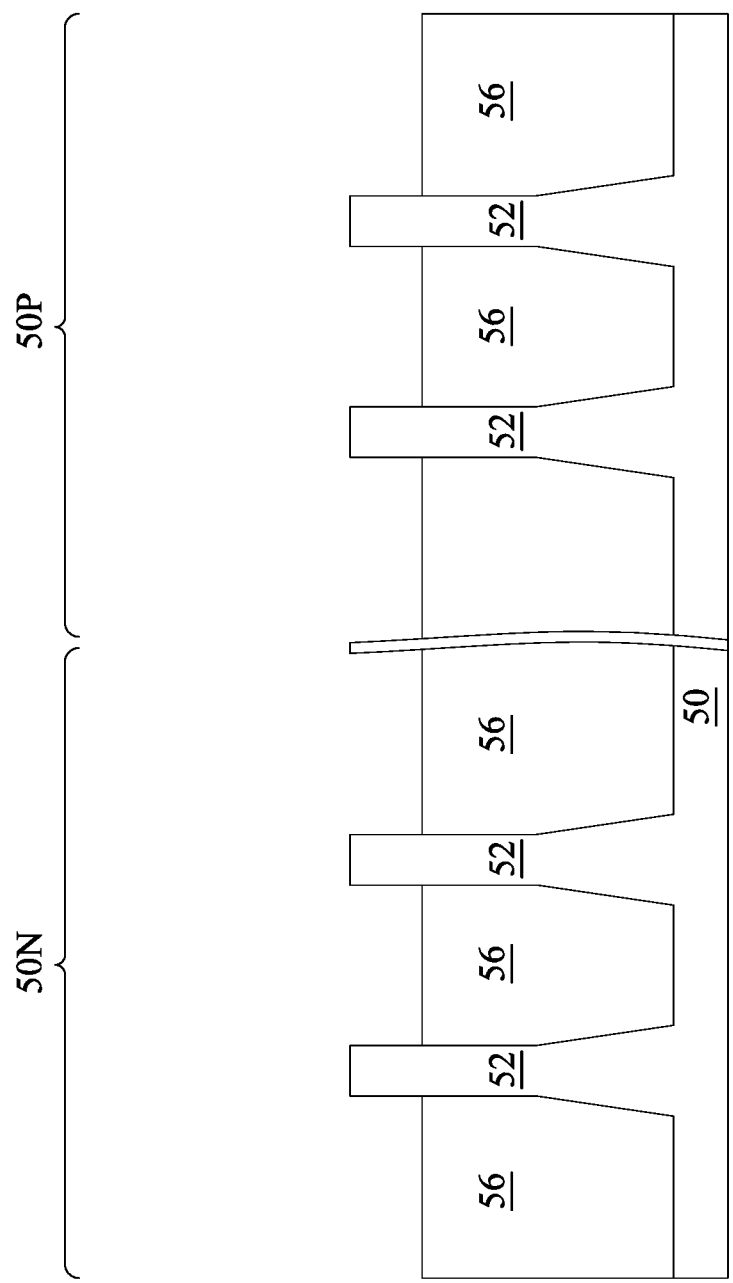

In FIG. 6, the insulation material 54 is recessed to form Shallow Trench Isolation (STI) regions 56, in accordance with some embodiments. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etch process, such as one that is selective to the material of the insulation material 54 (e.g., etches the material of the insulation material 54 at a faster rate than the material of the fins 52). For example, an oxide removal process using dilute hydrofluoric acid (dHF) may be used, though other processes are possible.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P. In the embodiments with different well types, the different implantation steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implantation is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ $cm^{-3}$, such as in the range of about $10^{16}$ $cm^{-3}$ to about $10^{18}$ $cm^{-3}$. After the implantation, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implantation may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ $cm^{-3}$, such as in the range of about $10^{16}$ $cm^{-3}$ to about $10^{18}$ $cm^{-3}$. After the implantation, the photoresist may be removed, such as by an acceptable ashing process.

After the implanting of the n-type region 50N and the p-type region 50P, an annealing may be performed to repair implantation damage and to activate the p-type and/or n-type impurities that were implanted. In some embodiments, the grown materials of epitaxial fins may be in situ doped during growth, which may obviate the implantations, although in situ and implantation doping may be used together.

Figure 7:
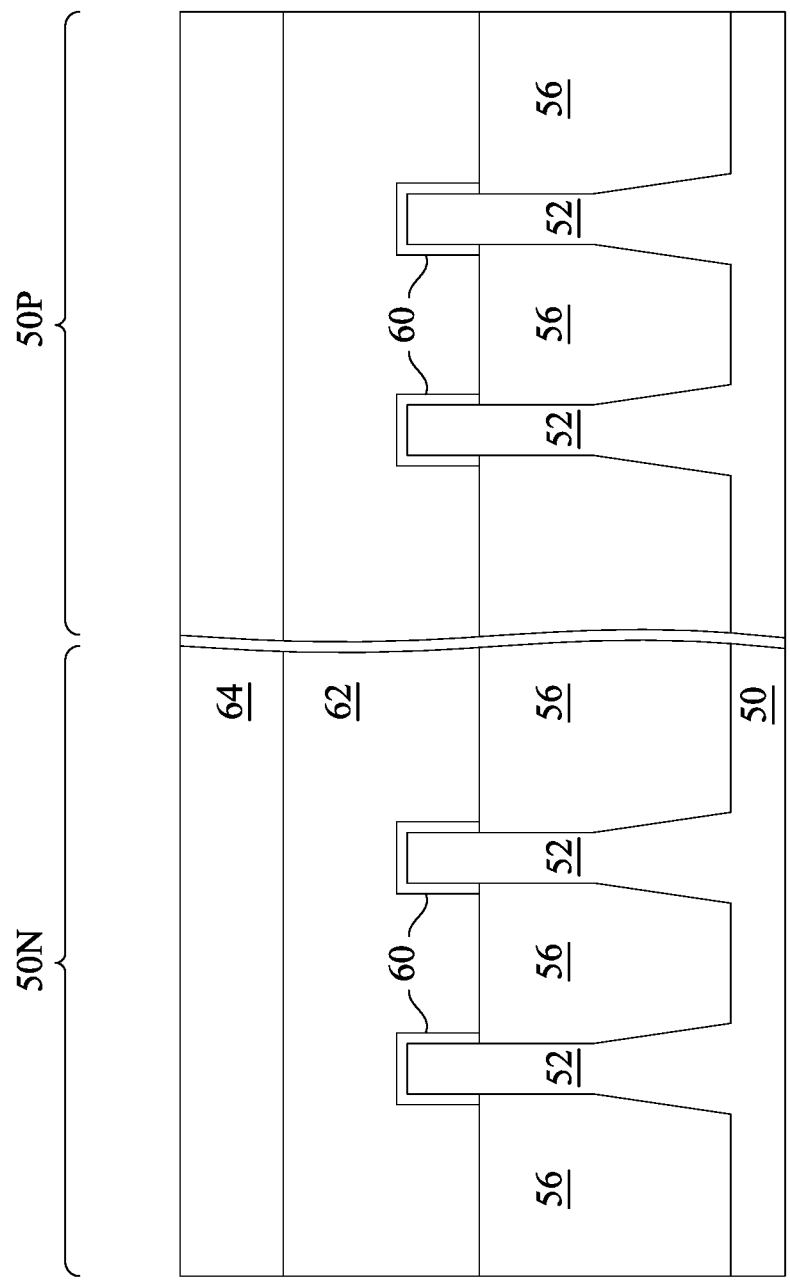

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. The mask layer 64 may be deposited over the dummy gate layer 62. The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56. The mask layer 64 may include, for example, one or more layers of silicon oxide, SiN, SiON, a combination thereof, or the like. In some embodiments, the mask layer 64 may comprise a layer of silicon nitride and a layer of silicon oxide over the layer of silicon nitride. In some embodiments, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 28B illustrate various additional steps in the manufacturing of embodiment devices. FIGS. 8A through 28B illustrate features in either of the n-type region 50N and the p-type region 50P. For example, the structures illustrated in FIGS. 8A through 28B may be applicable to both the n-type region 50N and the p-type region 50P. Differences (if any) in the structures of the n-type region 50N and the p-type region 50P are described in the text accompanying each figure.

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implantations for lightly doped source/drain (LDD) regions (not explicitly illustrated) may be performed. In the embodiments with different device types, similar to the implantations discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. In some embodiments, the lightly doped source/drain regions may have a concentration of impurities in the range of about $10^{15}$ cm$^{-3}$ to about $10^{19}$ cm$^{-3}$. An annealing may be used to repair implantation damage and/or to activate the implanted impurities.

Figure 9B:
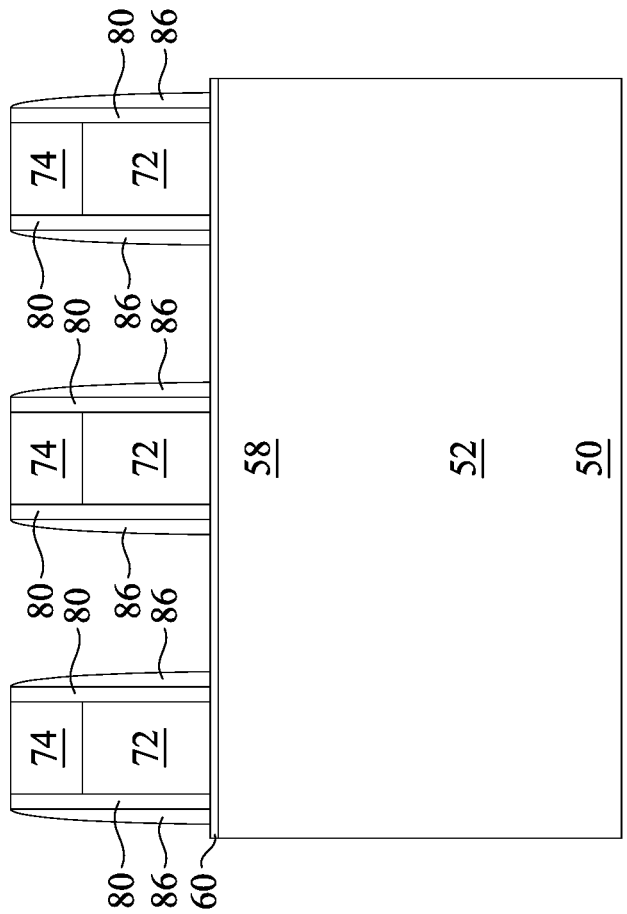
Figure 9A:
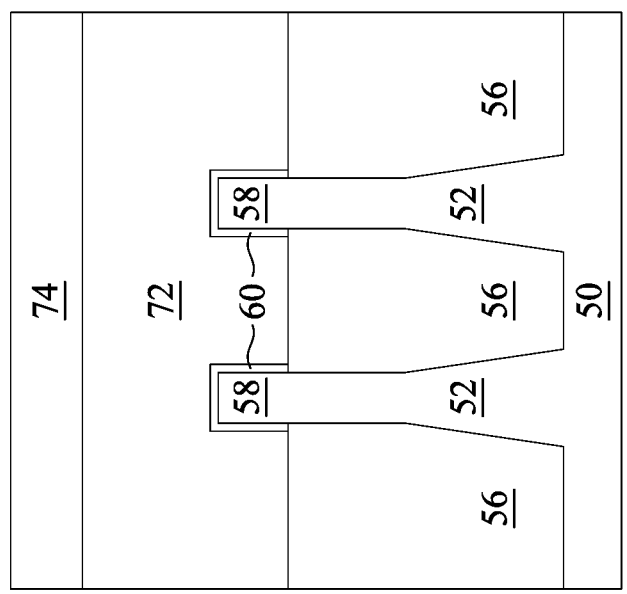

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. In some embodiments, the gate spacers 86 comprise multiple layers, which may be layers of different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
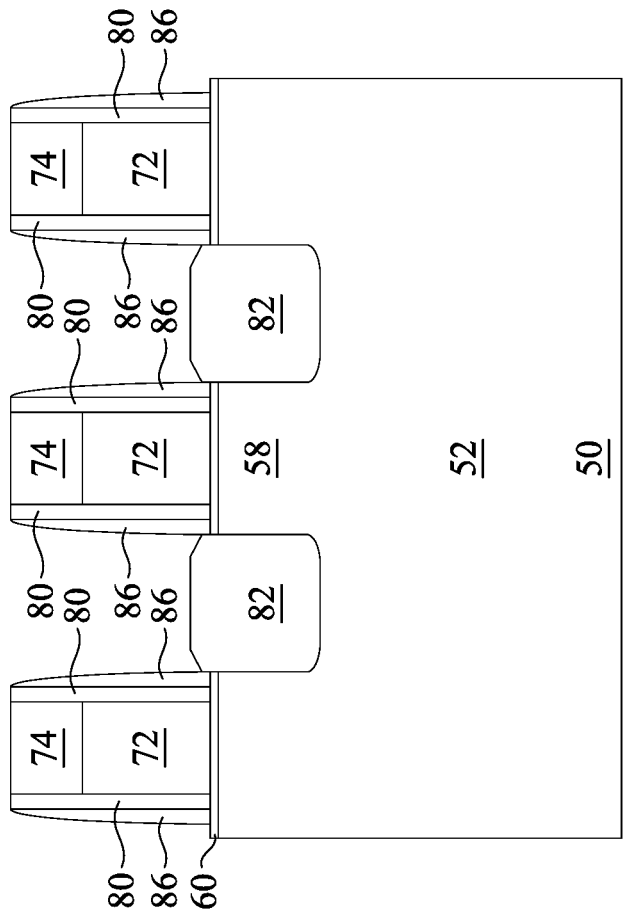
Figure 10A:
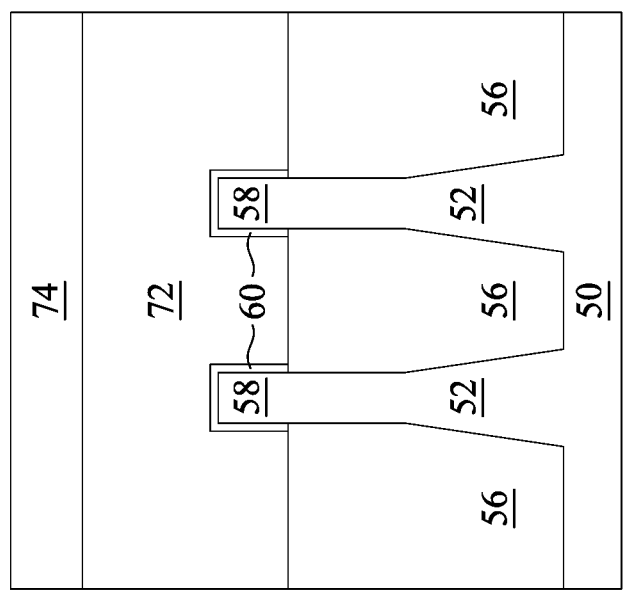
Figure 10C:
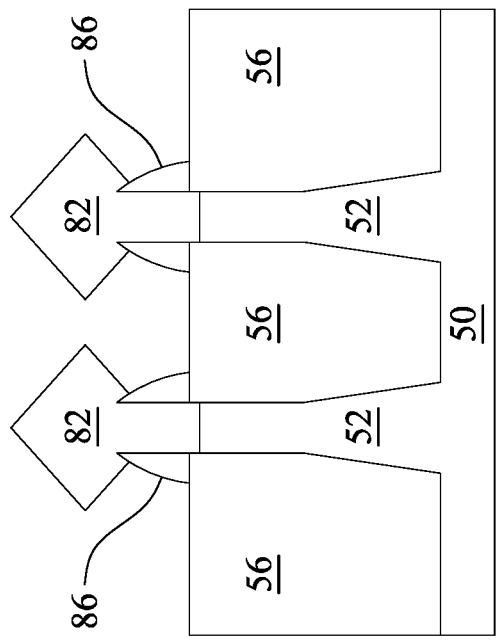
Figure 10D:
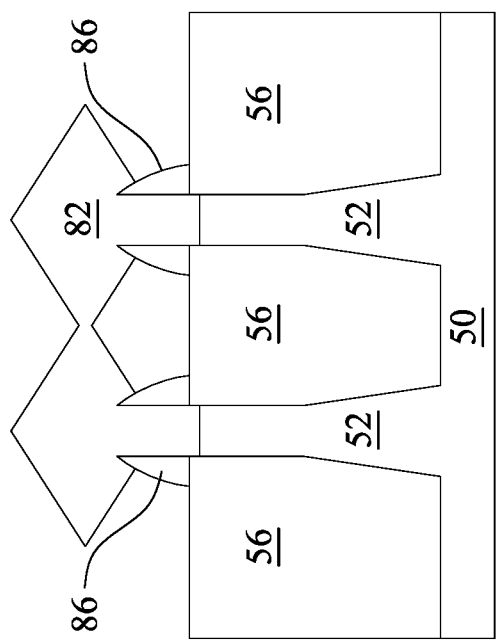

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an annealing. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent epitaxial source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56, thereby blocking the epitaxial growth. In some other embodiments, the spacer etch used to form the gate spacers 86 may be adjusted to remove the spacer material to allow the epitaxially grown region to extend to the surface of the STI region 56.

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include an oxide, phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13B:
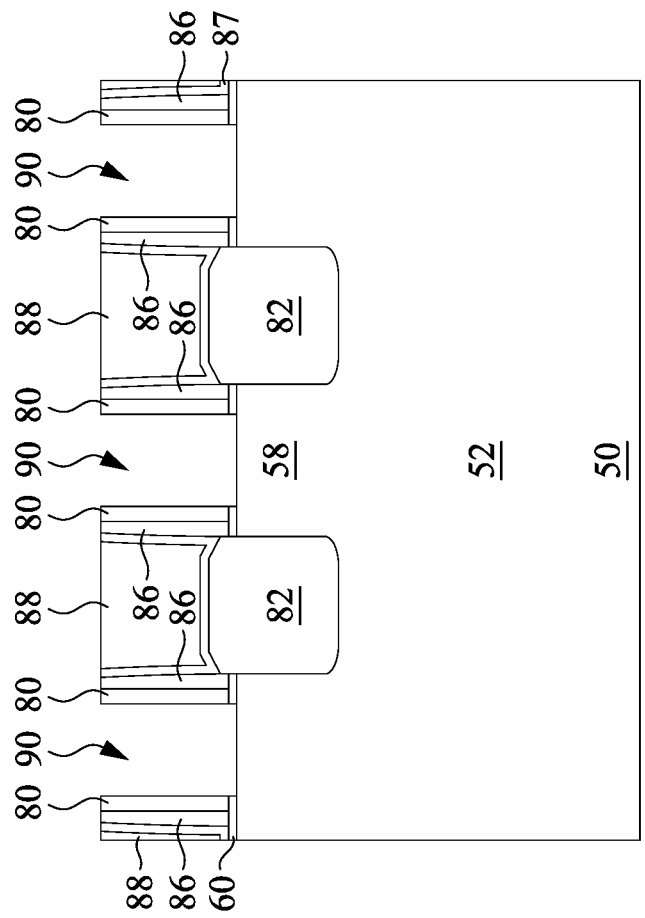
Figure 13A:
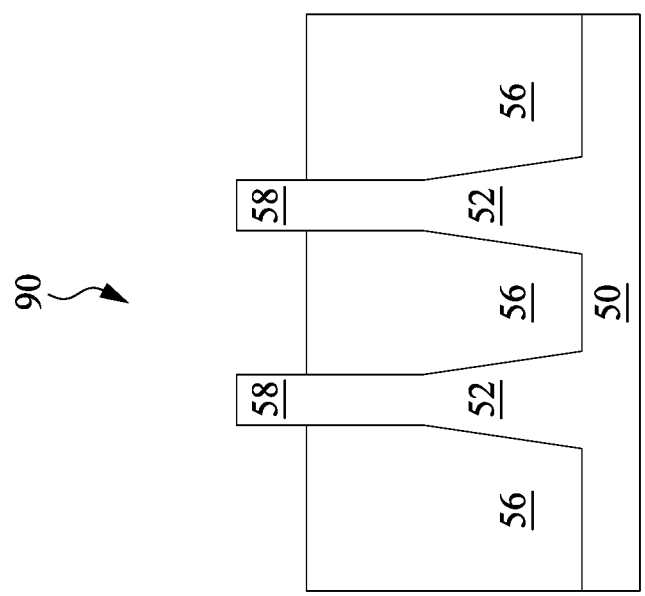

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etch process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14C:
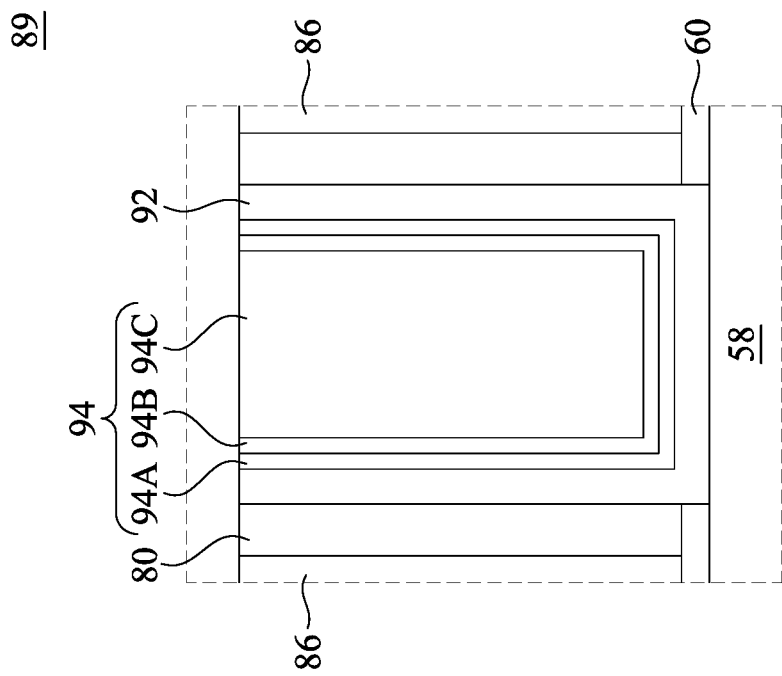

In FIGS. 14A and 14B, gate dielectric layers 92 and gate electrodes 94 are formed for replacement gates. FIG. 14C illustrates a detailed view of region 89 of FIG. 14B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k-value greater than about 7.0. The formation methods of the gate dielectric layers 92 may include Molecular-Beam Deposition (MBD), atomic layer deposition (ALD), PECVD, and the like. In embodiments where portions of the dummy dielectric layer 60 remains in the recesses 90, the gate dielectric layers 92 include a material of the dummy dielectric layer 60 (e.g., silicon oxide or the like).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "replacement gate," a "gate structure," or a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In FIGS. 15A and 15B, the gate stacks (e.g., the gate dielectric layers 92 and the gate electrodes 94) are recessed and dielectric layers 100 are formed over the gate stacks, in accordance with some embodiments. The dielectric layers 100 may be formed, for example, by recessing the gate stacks and depositing the dielectric material of the dielectric layers 100 on the recessed gate stacks. In some embodiments, the gate stacks are recessed below the top surface of the first ILD 88. The gate stacks may be recessed using one or more etch processes, which may include one or more wet etch processes, dry etch processes, or a combination thereof. The one or more etch processes may comprise anisotropic etch processes.

The dielectric layers 100 are then formed on the recessed gate stacks and over the first ILD 88. In some embodiments, the dielectric layers 100 may comprise silicon nitride, silicon carbide, silicon carbonitride, another type of nitride, a combination thereof, or the like, and may be formed using ALD, CVD, PVD, a combination thereof, or the like. In some cases, using oxygen-free materials to form the dielectric layers 100 may reduce the oxidation on the gate electrodes 94. In some embodiments, the dielectric layers 100 may comprise silicon oxide, silicon oxynitride, a metal oxide, another type of oxide, a combination thereof, or the like. The dielectric layers 100 may be formed in a self-aligned manner, and sidewalls of a dielectric layer 100 may be aligned with respective sidewalls of the gate seal spacers 80 or the gate spacers 86. A planarization process, such as CMP process, may be performed to remove excess material of the dielectric layers 100 (e.g., from over the first ILD 88). In some embodiments, top surfaces of the dielectric layers 100, top surfaces of the gate spacers 86, and top surfaces of the first ILD 88 may be level. In some embodiments, the dielectric layers 100 may be formed having a thickness in the range of about 10 nm to about 20 nm.

FIGS. 16A through 17B illustrate the formation of conductive features 122 (see FIG. 17B), in accordance with some embodiments. The conductive features 122 provide electrical connections to respective epitaxial source/drain regions 82 and in some cases may be considered "source/drain contact plugs" or the like.

FIGS. 16A and 16B illustrate a patterning process of the first ILD 88 and the CESL 87 to form openings 118, in accordance with some embodiments. The openings 118 may expose surfaces of the epitaxial source/drain regions 82. The patterning may be performed using acceptable photolithography and etching techniques. For example, a photoresist may be formed over the first ILD 88 and the dielectric layers 100 and patterned. The photoresist can be formed by using, for example, a spin-on technique and can be patterned using acceptable photolithography techniques. One or more suitable etch processes may be performed using the patterned photoresist as an etch mask, forming the openings 118. The one or more etch processes may include wet and/or dry etch processes. One or more of the etch processes may be anisotropic. FIGS. 16A-16B show the openings 118 as having sloped sidewalls, but the openings 118 may have substantially vertical sidewalls, curved sidewalls, or another sidewall profile than shown.

Figure 17B:
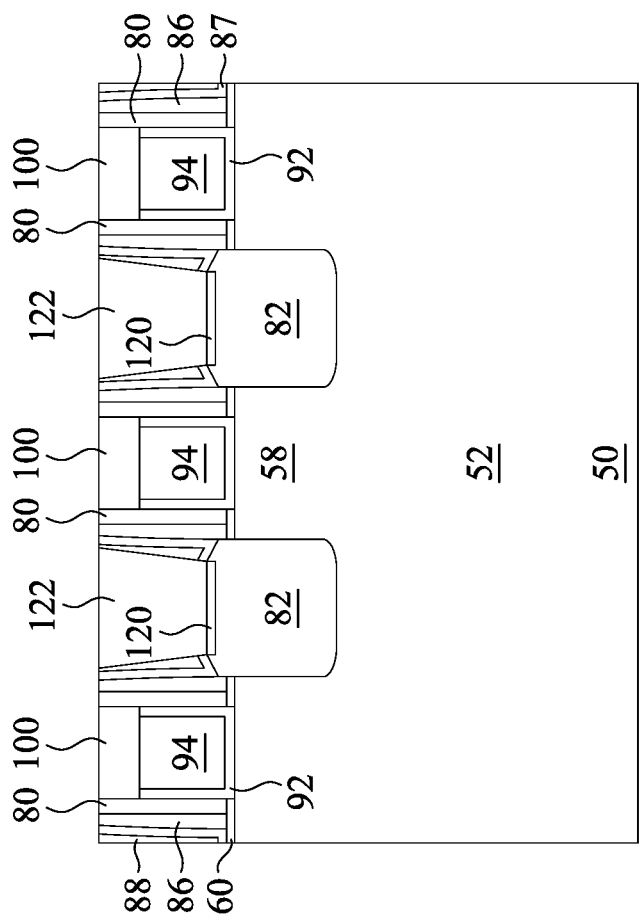
Figure 17A:
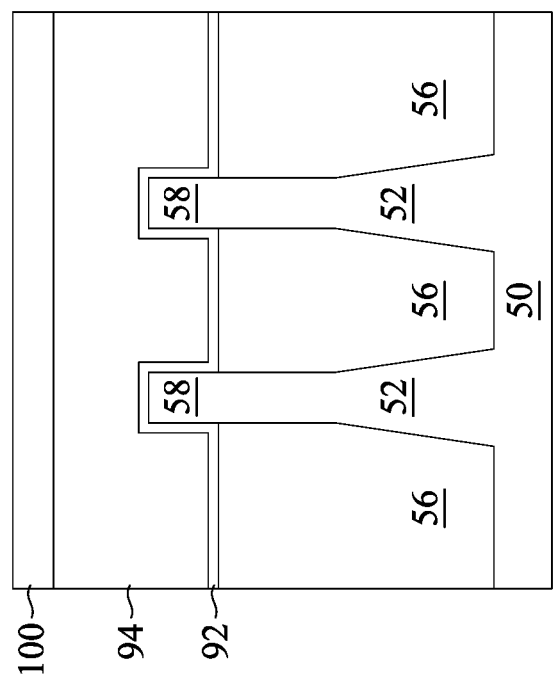

In FIGS. 17A and 17B, silicide layers 120 and conductive features 122 are formed in the openings 118, in accordance with some embodiments. The silicide layers 120 may be formed, for example, by depositing a metallic material in the openings 118. The metallic material may comprise Ti, Co, Ni, NiCo, Pt, NiPt, Ir, PtIr, Er, Yb, Pd, Rh, Nb, a combination thereof, or the like, and may be formed using ALD, CVD, PVD, sputtering, a combination thereof, or the like. Subsequently, an annealing process is performed to form the silicide layers 120. In some embodiments in which the epitaxial source/drain regions 82 comprise silicon, the annealing process may cause the metallic material to react with silicon to form a silicide of the metallic material at interfaces between the metallic material and the epitaxial source/drain regions 82. After forming the silicide layers 120, unreacted portions of the metallic material may be removed using a suitable removal process, such as a suitable etch process, for example.

After forming the silicide layers 120, conductive features 122 are formed in the openings 118. The conductive features 122 provide electrical connections to respective epitaxial source/drain regions 82. In some embodiments, the conductive features 122 are formed by forming a liner (not shown), such as a barrier layer, an adhesion layer, or the like, and a conductive fill material are in the openings 118. For example, a barrier layer may first be formed in the openings 118. The barrier layer may extend along a bottom and sidewalls of the openings 118. The barrier layer may comprise titanium, titanium nitride, tantalum, tantalum nitride, a combination thereof, a multilayer thereof, or the like, and may be formed by ALD, CVD, PVD, sputtering, a combination thereof, or the like. Subsequently, an adhesion layer (not individually shown) may be formed over the barrier layer within the openings 118. The adhesion layer may comprise cobalt, ruthenium, an alloy thereof, a combination thereof, a multilayer thereof, or the like, and may be formed by ALD, CVD, PVD, sputtering, a combination thereof, or the like. The barrier layer and/or the adhesion layer may be omitted in other embodiments.

A conductive fill material is then formed in the openings 118 to form the conductive features 122. The conductive fill material may comprise cobalt, tungsten, ruthenium, copper, combinations thereof, alloys thereof, multilayers thereof, or the like, and may be formed using, for example, by plating, ALD, CVD, PVD, or other suitable methods. For example, in some embodiments, the conductive fill material may be formed by first forming a seed layer (not individually shown) over the adhesion layer within the openings 118. The seed layer may comprise copper, titanium, nickel, gold, manganese, a combination thereof, a multilayer thereof, or the like, and may be formed by ALD, CVD, PVD, sputtering, a combination thereof, or the like. The conductive fill material may then be formed over the seed layer within the openings 118. Other techniques for forming the conductive fill material are possible.

In some embodiments, the conductive fill material overfills the openings 118. After forming the conductive fill material, a planarization process may be performed to remove portions of the conductive fill material overfilling the openings 118. If present, portions of the barrier layer, the adhesion layer, and/or the seed layer may also be removed. Remaining portions of the barrier layer, the adhesion layer, the seed layer, and the conductive fill material form the conductive features 122 in the openings 118. The planarization process may comprise a CMP process, an etching back process, a grinding process, combinations thereof, or the like. After performing the planarization process, top surfaces of the conductive features 122 and the top surfaces of the dielectric layers 100 may be substantially level. In other embodiments, a planarization process is not performed. In some embodiments, an optional annealing process is performed after the planarization process to recrystallize the conductive features 122, to enlarge the grain structure of the conductive features 122, to reduce micro-voids in the conductive features 122, and/or to reduce impurities in the conductive features 122.

Figure 18B:
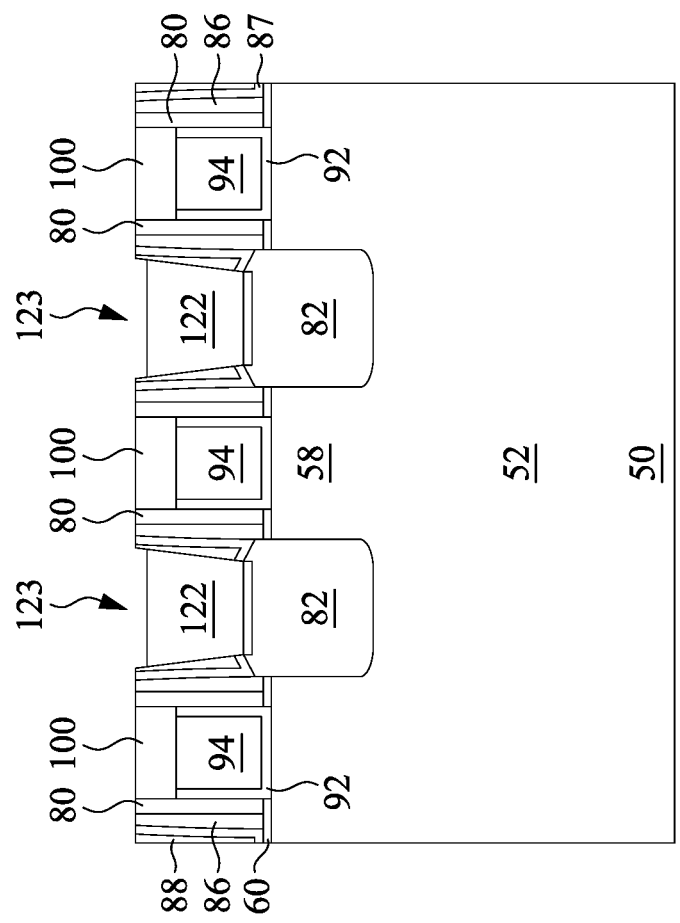
Figure 18A:
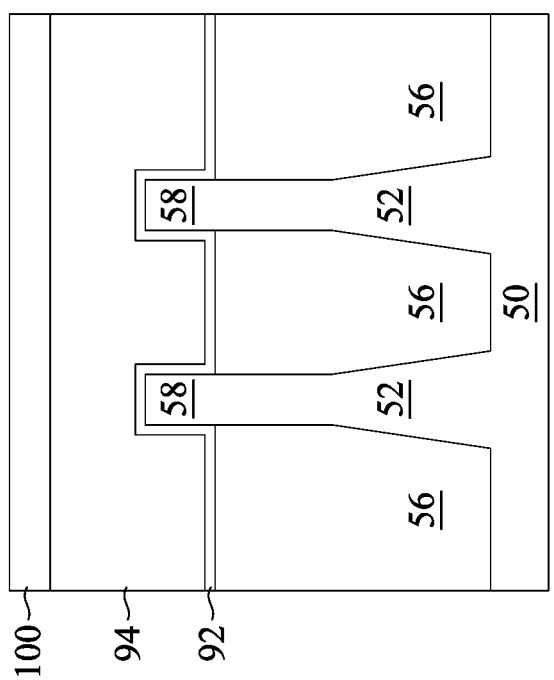

FIGS. 18A and 18B illustrate a process of patterning the conductive features 122 to form recesses 123, in accordance with some embodiments. The patterning may be performed using acceptable photolithography and etching techniques. For example, a photoresist may be formed over the conductive features 122 and the first ILD 88 and patterned. The photoresist can be formed by using, for example, a spin-on technique and can be patterned using acceptable photolithography techniques. One or more suitable etch processes may be performed using the patterned photoresist as an etch mask, forming the recesses 123. The one or more etch processes may include wet and/or dry etch processes. The wet etchant utilized may be hydrogen peroxide, hydrochloric acid, phosphoric acid, nitric acid, ammonia, or other suitable wet etchant. The dry etchant utilized may be chlorine, oxygen, or other suitable dry etchant. The wet etch processes may be performed at a temperature in the range of about room temperature to about 200° C. The dry etchant utilized may be chlorine, fluorine, hydrogen, acetylacetone, hexafluoroacetylacetone, or other suitable dry etchant. The dry etch processes may be performed at a temperature in the range of about room temperature to about 300° C. One or more of the etch processes may be anisotropic. In some embodiments, a selective dry etch process using, for example, $Cl_2/O_2$ may be used without the use of a mask layer. The depths of the recesses 123 may be in the range of about 1 nm to about 10 nm, though other depths are possible. In some embodiments, recesses 123 may expose sidewalls of the first ILD 88.

In FIGS. 19A and 19B, an etch stop layer 124 is deposited over the structure illustrated in FIGS. 18A and 18B. In some embodiments, the etch stop layer 124 may fully fill in the recesses 123. As discussed in greater detail below, a second dielectric layer 126 (shown in FIGS. 21A-21B) will be formed over the etch stop layer 124 and a conductive feature 142 (shown in FIGS. 26A-26B) will be formed through the second dielectric layer 126 to contact the conductive feature 122, wherein the etch stop layer 124 will act as an etch stop layer during the etch process. The etch stop layer 124 may be formed of a dielectric material having a lower etch rate that the subsequently formed dielectric layer 126. The dielectric material may be aluminum oxide, aluminum nitride, tungsten nitride, molybdenum oxide, molybdenum nitride, boron nitride, or the like, and may be deposited by any suitable method, such as ALD, CVD, plasma-enhanced ALD (PEALD), or PECVD. Other dielectric materials formed by any acceptable process may be used. In some embodiments, the materials used to form the etch stop layer 124 is different from the materials used to form the dielectric layers 100. In some embodiments, aluminum oxide is deposited using ALD with trimethylaluminium (TMA) and a hydrocarbon-based alcohol as precursors at a temperature in the range of about 250° C. to about 500° C. The hydrocarbon-based alcohol may act as an oxygen source during the deposition because it has a weaker oxidizing strength than an oxygen source such as oxygen, ozone, water, and nitrous oxide. The weaker oxidizing strength of the hydrocarbon-based alcohol may help to reduce oxidation in the conductive features 122. In some embodiments, ALD or CVD may be utilized for the aluminum oxide deposition. In this case, the oxygen source is provided by remote plasma, which may also help to reduce oxidation in the conductive features 122 and increase the deposition rate of the etch stop layer 124. In some embodiments, aluminum nitride is deposited using ALD with trimethylaluminium (TMA) and ammonia as precursors at a temperature in the range of about 250° C. to about 500° C.

Figure 20B:
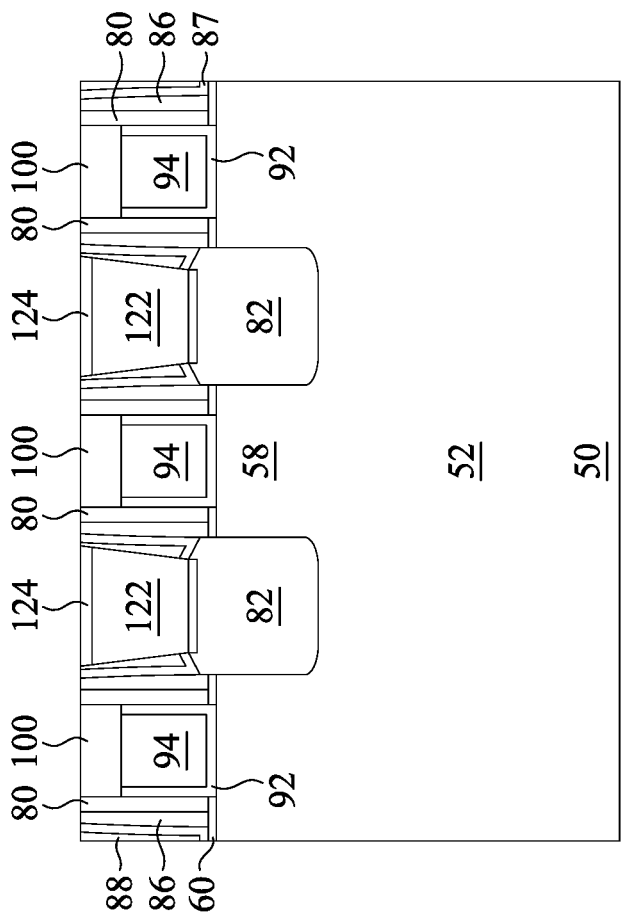
Figure 20A:
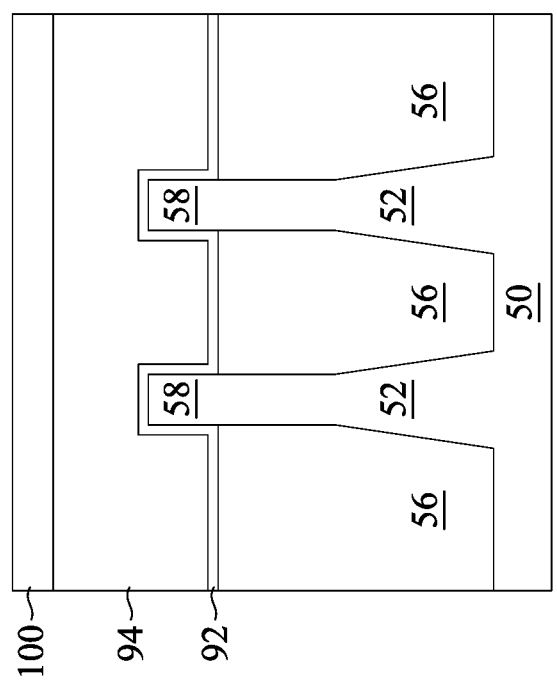

In FIGS. 20A and 20B, a planarization process, such as a CMP, is performed to remove the excess material of the etch stop layer 124 (e.g., from over the dielectric layers 100). In some embodiments, after the planarization process, top surfaces of the etch stop layers 124, the first ILD 88, the CESL 87, the gate spacers 86, gate seal spacers 80, and the dielectric layers 100 may be level. The thicknesses of the etch stop layer 124 may be in the range of about 1 nm to about 10 nm, though other thicknesses are possible. In some embodiments, the thickness of the etch stop layer 124 is different from the thickness of dielectric layers 100. In some embodiments, the thickness of the etch stop layer 124 is smaller than the thickness of dielectric layers 100. In some embodiments, the etch stop layers 124 may extend between the sidewalls of the first ILD 88 and/or may be in physical contact with sidewalls of the first ILD 88. The etch stop layers 124 may have various top surface profiles, which is discussed in greater detail later with respect to FIGS. 29A, 29B, and 29C.

In FIGS. 21A and 21B, a second ILD 126 is formed over the first ILD 88, the dielectric layers 100, and etch stop layers 124. In some embodiments, the second ILD 126 may be a material similar to that of the first ILD 88, and may be formed in a similar manner. For example, the second ILD 126 may be formed of a dielectric material such as an oxide, PSG, BSG, BPSG, USG, or the like, and may be deposited by any suitable method, such as CVD, PECVD, or FCVD. The second ILD 126 may have various top and bottom surface profiles, which is discussed in greater detail later with respect to FIGS. 30A, 30B, and 30C. An annealing process may be performed after the second ILD 126 is formed. In some embodiments, the annealing process may be performed at a temperature in the range of about 250° C. to about 450° C. In some embodiments, the annealing process may be performed for a duration in the range of about 1 min to about 1 h. The second ILD 126 may have various top and bottom surface profiles after annealing, which is discussed in greater detail later with respect to FIGS. 31A, 31B, and 31C.

In some embodiments, the material of etch stop layers 124 and/or the material of the second ILD 126 are chosen such that the etch rate of etch stop layers 124 is less than the etch rate of the second ILD 126 during an etch process of subsequently forming openings 134 and 135 (shown in FIGS. 24A-24B) through the second ILD 126. Because of the etch stop layers 124, the second ILD 126 may be formed over the first ILD 88, the dielectric layers 100, and the conductive features 122 without depositing a blanket etch stop layer, thereby allowing for a thinner overall device.

Figure 22B:
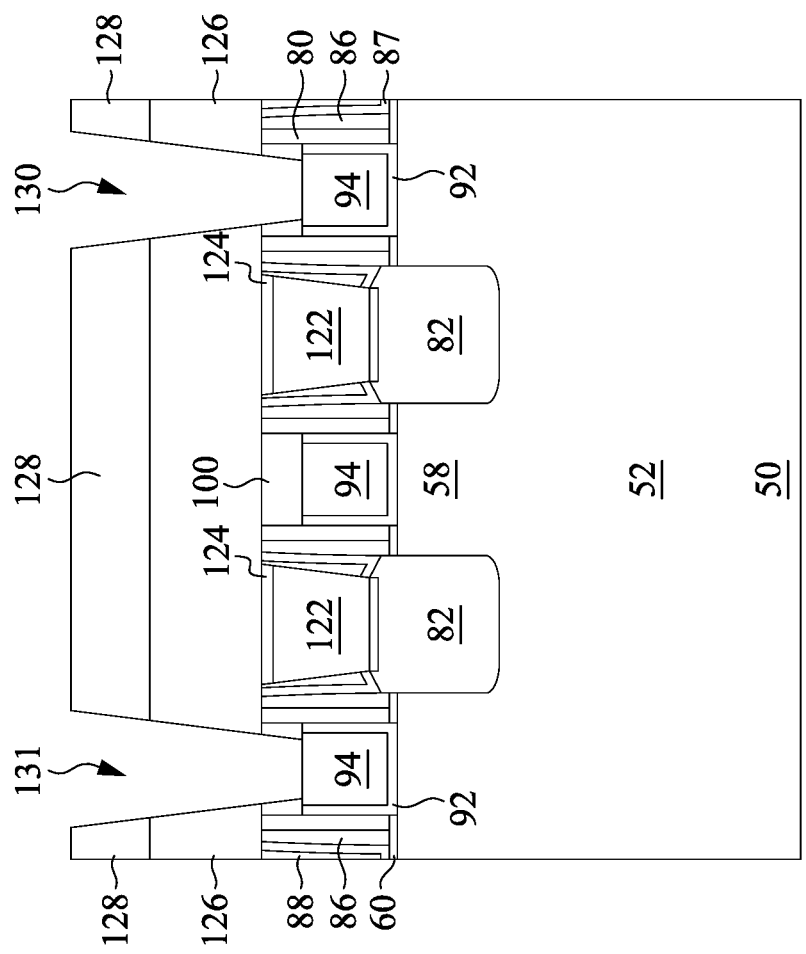
Figure 22A:
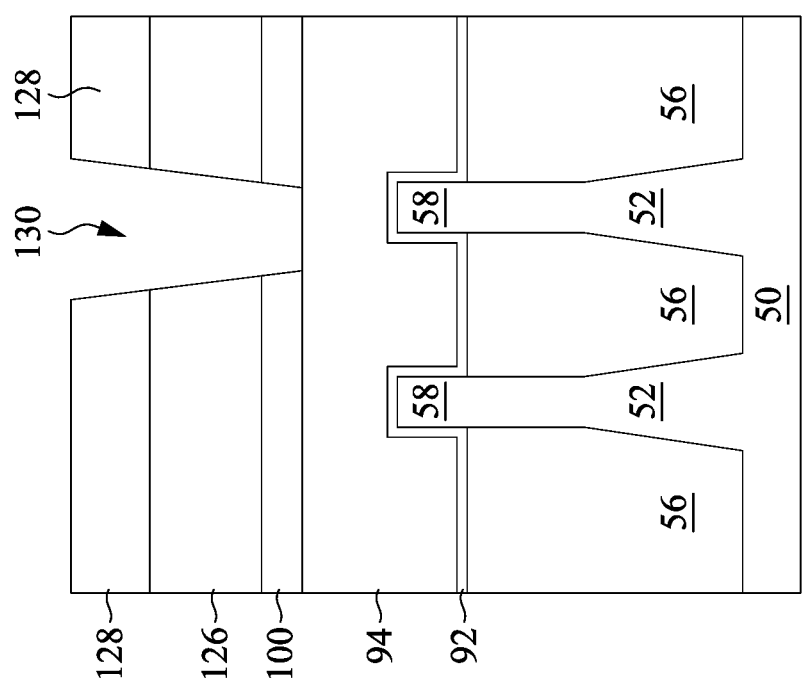

FIGS. 22A and 22B illustrate the patterning of the second ILD 126 and the dielectric layers 100 to form openings 130 and 131, in accordance with some embodiments. The openings 130 and 131 extend through the second ILD 126 and the dielectric layers 100 to expose top surfaces of the gate electrodes 94. The second ILD 126 and the dielectric layers 100 may be patterned using acceptable photolithography and etching techniques. For example, a first photoresist 128 may be formed over the second ILD 126 and patterned using suitable photolithography techniques. The first photoresist 128 may be a single layer or multilayer photoresist structure, and may be deposited using suitable techniques such as spin-on or deposition techniques. One or more suitable etch processes may then be performed using the patterned first photoresist 128 as an etch mask and the dielectric layers 100 as an etch stop layer while etching through the second ILD 126, thereby forming the openings 130 and 131. The one or more etch processes may include wet and/or dry etch processes. FIGS. 22A and 22B show the openings 130 and 131 as having sloped sidewalls, but the openings 130 or 131 may have substantially vertical sidewalls, curved sidewalls, or another sidewall profile in other embodiments. The first photoresist 128 may be removed using a suitable process such as an ashing or etch process.

As discussed previously, by forming etch stop layers 124 over the conductive features 122, the second ILD 126 may be formed over the first ILD 88, the dielectric layers 100, and the conductive features 122 without depositing a blanket etch stop layer, thereby reducing a thickness of the layers above gate electrodes 94 that need to be etched when forming the openings 130 and 131. Reducing the thickness may result in better profiles of the openings 130 and 131.

In FIGS. 23A and 23B, a second photoresist 132 is formed over the second ILD 126 and within the openings 130 and 131, in accordance with some embodiments. The second photoresist 132 may be a single layer or multilayer photoresist structure, and may be deposited using suitable techniques such as spin-on or deposition techniques. As shown in FIG. 23B, the second photoresist 132 may overfill the openings 130 and 131 and extend over the second ILD 126.

Figure 24B:
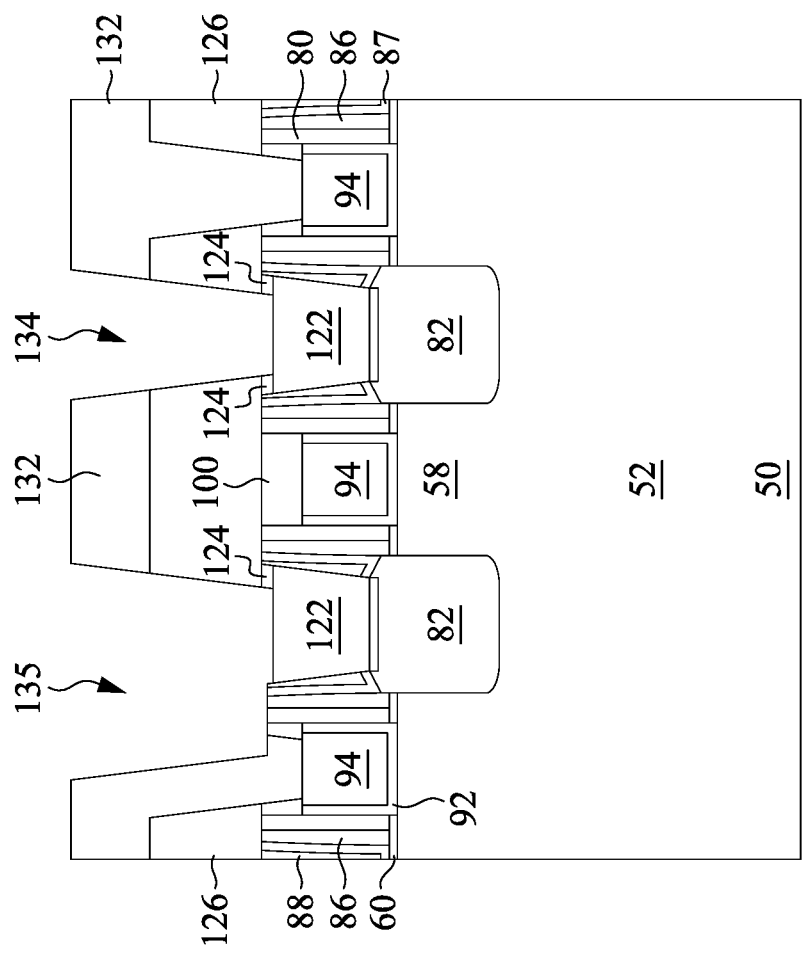
Figure 24A:
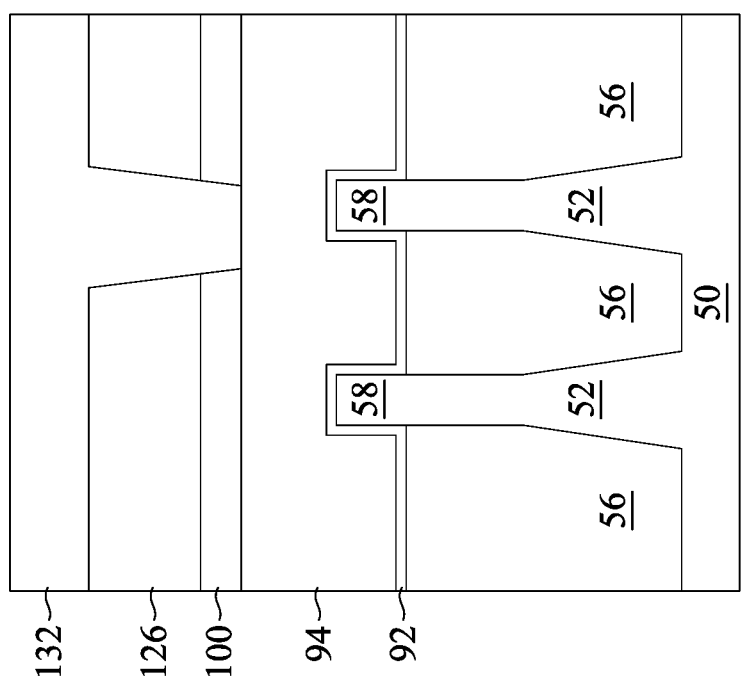

FIGS. 24A and 24B illustrate the patterning of the second photoresist 132, the second ILD 126, and the etch stop layers 124 to form openings 134 and 135, in accordance with some embodiments. The openings 134 and 135 extend through the second ILD 126 and the etch stop layers 124 to expose the top surfaces of the conductive features 122. The second photoresist 132, the second ILD 126 and the etch stop layers 124 may be patterned using acceptable photolithography and etching techniques. One or more suitable etch processes may then be performed using the patterned second photoresist 132 as an etch mask, forming the openings 134 and 135. The one or more etch processes may include wet and/or dry etch processes.

In some embodiments, an etch process may be used to etch the second ILD 126. In some embodiments, a dry etch process using a gas mixture of $CF_4/H_2/N_2/Ar$, $NF_2/H_2/N_2/Ar$, or the like is utilized. The etch process may be performed with a power in the range of about 50W to about 1000W and at a temperature in the range of about −20° C. to about 200° C. During the etch process, the etch rate of the second ILD 126 over the etch rate of the etch stop layers 124 may be in the range of about 4:1 to about 1000:1. As a result, the etch process may remove portions of the second ILD 126 and then stop or slow down at the etch stop layers 124, which reduces the chance of over-etching of the conductive features 122, and therefore reduces the chance of forming leakage paths or other defects.

A separate etch process may be performed to remove the portions of the etch stop layers 124 and expose the top surfaces of the conductive features 122. The separate etch process may use different etchants from the etch process used to etch the second ILD 126. In some embodiments, the etch stop layers 124 may be dry etched using, for example, a gas mixture of $N_2/H_2/O_2$ or the like. The dry etch process may be performed with a power in the range of about 50W to about 1000W and at a temperature in the range of about −20° C. to about 200° C. In some embodiments, a wet etch process is used to etch the etch stop layers 124 using hydrogen fluoride, hydrogen peroxide, water, chelating agent, or the like. The wet etch process may be performed at a temperature in the range of about 0° C. to about 100° C.

In some embodiments, the openings 134 or 135 may expose sidewalls of the etch stop layers 124. In some embodiments, the openings 134 or 135 may expose sidewalls of the first ILD 88. In some embodiments, the openings 134 or 135 may expose sidewalls of the CESL 87. FIGS. 24A and 24B show the openings 134 and 135 as having sloped sidewalls, but the openings 134 or 135 may have substantially vertical sidewalls, curved sidewalls, or another sidewall profile in other embodiments.

In some embodiments, the etch process(es) may form an opening for a butted contact, e.g., a joint or combined contact to the conductive feature 122 (coupled to the source/drain region 82) and an adjacent gate electrode 94. For example, the opening 135 illustrated in FIG. 24B illustrates an example in which the opening 135 overlaps the second photoresist 132 above the gate electrode 94 on the left side of the figure. In subsequent processing, the second photoresist 132 is removed, thereby forming an opening exposing both the gate electrode 94 and the conductive feature 122. The etch rate of the materials of the various layers (e.g., the gate seal spacer 80, the gate spacer 86, the CESL 87, the first ILD 88, the dielectric layer 100, and/or the second photoresist 132) may be different from the etch rate of the material of the etch stop layer 124. The difference in the etch rates may cause an upper surface of the gate seal spacer 80, the gate spacer 86, the CESL 87, the first ILD 88, the dielectric layer 100, and/or the second photoresist 132 to be the same, higher or lower than the upper surface of the conductive feature 122. FIG. 24B illustrates an example of the etch rate of the gate seal spacer 80, the gate spacer 86, the CESL 87, the first ILD 88, the dielectric layer 100, and/or the second photoresist 132 being less than the etch rate of the etch stop layer 124.

Figure 25B:
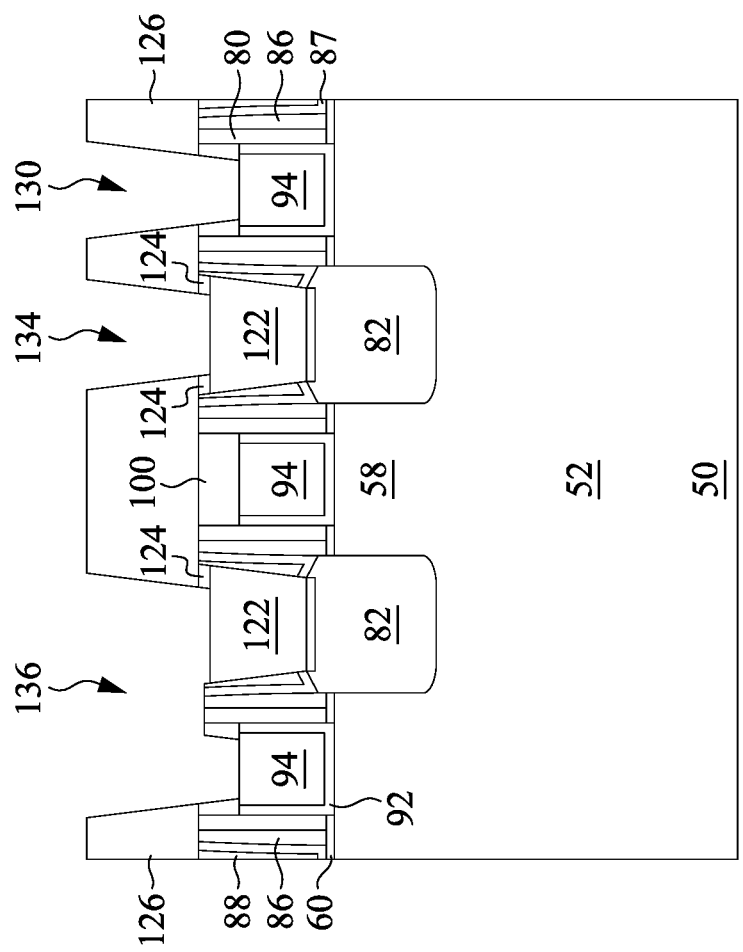
Figure 25A:
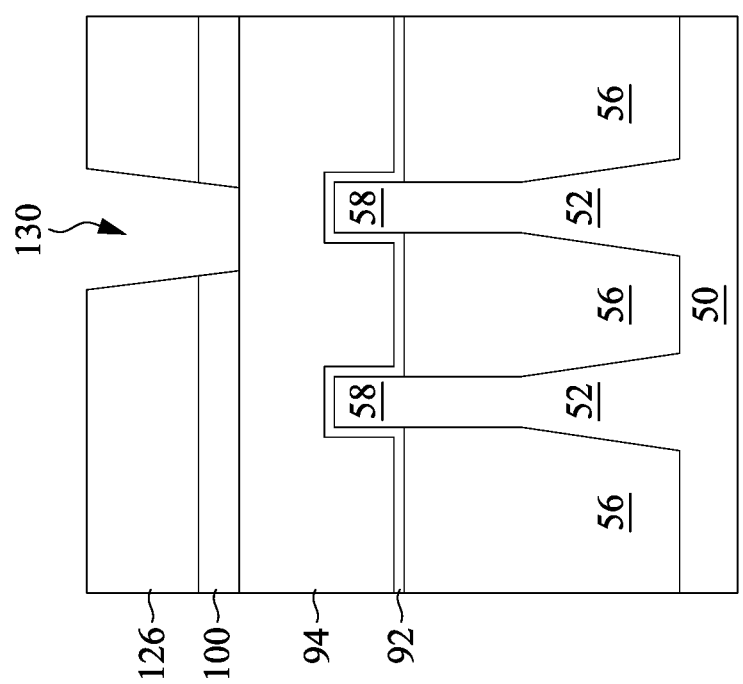

In FIGS. 25A and 25B, the second photoresist 132 is removed, forming openings 130, 134, and 136, in accordance with some embodiments. The second photoresist 132 may be removed using a suitable technique, such as by ashing, etching, or the like. As shown in FIGS. 25A and 25B, removing the second photoresist 132 reveals the previously formed opening 130 that exposes the top surface of the gate electrode 94. Due to the overlap between the previously formed openings 131 and 135, removing the second photoresist 132 forms a combined opening 136 that exposes the top surface of the gate electrode 94 previously exposed by the opening 131 and the top surface of conductive feature 122 previously exposed by the opening 135. The opening 134 remains exposing the top surface of the conductive feature 122. In some embodiments, a wet cleaning process is performed before and/or after removing the second photoresist 132.

In FIGS. 26A and 26B, a conductive feature 140, the conductive feature 142, and a combined conductive feature 144 are formed respectively in the opening 130, the opening 134, and the combined opening 136. In some embodiments, forming the conductive features 140, 142 and 144 may comprise forming a liner (not shown), such as a barrier layer, an adhesion layer, or the like, and a conductive material in the openings 130, 134, and 136. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 126. The remaining liner and conductive material form the conductive features 140, 142 and 144. The conductive features 140, 142 and 144 may be formed in different processes or may be formed in the same process. Although shown as being formed in the same cross-sections, it should be appreciated that the conductive features 140, 142 and/or 144 may be formed in different cross-sections, which may avoid/reduce a risk of shorting. The conductive feature 142 may have various widths, which is discussed in greater detail later with respect to FIGS. 32A, 32B, and 32C.

The conductive feature 140 makes electrical connection to the gate electrode 94. Accordingly, the conductive feature 140 may be referred to as a gate contact or gate contact plug in some cases. The conductive feature 142 makes electrical connection to the conductive feature 122 that is electrically connected to the epitaxial source/drain region 82. Accordingly, a combination of the conductive feature 142 and the underlying conductive feature 122 may be also referred to as a source/drain contact or a source/drain contact plug in some cases. The combined conductive feature 144 is electrically connected to both the gate electrode 94 and the epitaxial source/drain region 82 (through a conductive feature 122). In this manner, a FinFET device comprising gate contact plugs and source/drain contact plugs may be formed. As discussed previously, by forming etch stop layers 124 over the conductive features 122, the second ILD 126 may be formed over the first ILD 88, the dielectric layers 100, and the conductive features 122 without depositing a blanket etch stop layer, which may provide better profiles of the conductive feature 140 and the combined conductive feature 144, and lead to a better electrical connection.

Figure 27B:
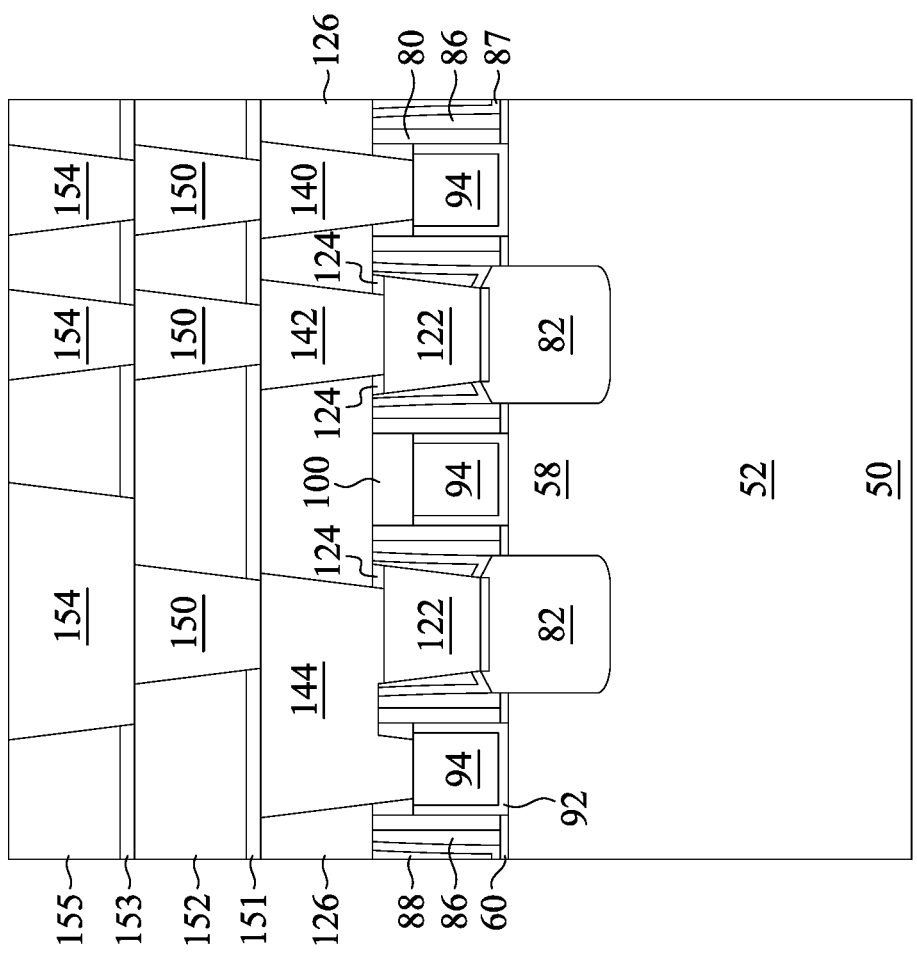
Figure 27A:
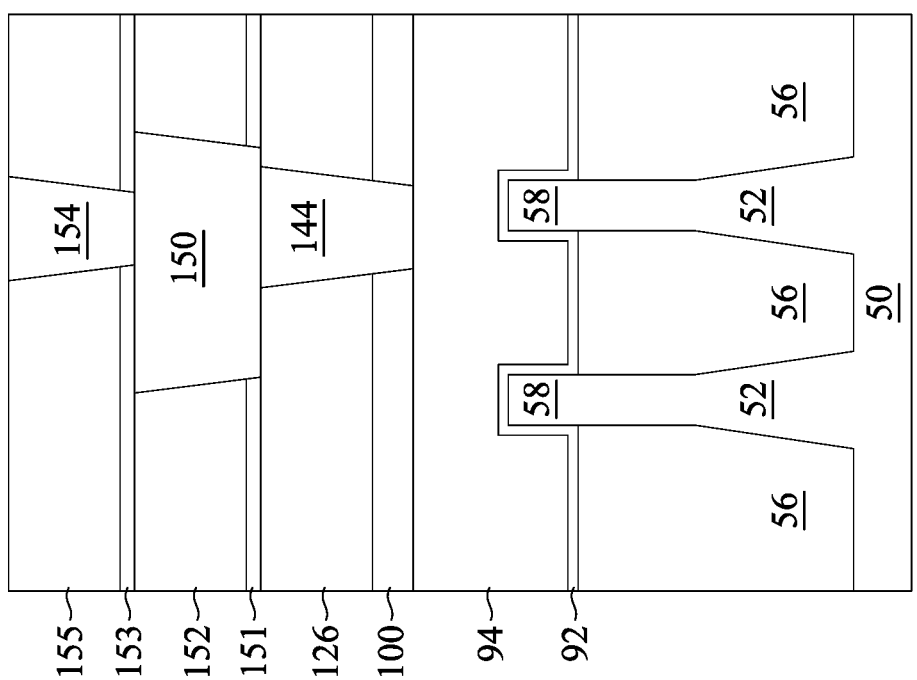

In FIGS. 27A and 27B, an interconnect structure comprising one or more layers of conductive features are formed over and electrically connected to the conductive features 140, 142, and 144. In some embodiments, the interconnect structure comprises a plurality of dielectric layers such as inter-metal dielectric layers (IMDs) and conductive features within the IMDs that provide various electrical interconnections. FIGS. 27A and 27B illustrate an embodiment comprising one IMD 152 with conductive features 150 and one IMD 155 with conductive features 154, but more or fewer IMDs or conductive features may be formed in other embodiments. The conductive features 150 and 154 may comprise electrical routing, conductive vias, conductive lines, or the like, and may be formed using a single damascene method, a dual damascene method, a combination thereof, or the like.

In some embodiments, an etch stop layer 151 may first be deposited over the second ILD 126 and conductive features 140, 142, and 144. The etch stop layer 151 may comprise a material such as silicon nitride, silicon oxynitride, aluminum oxide, aluminum nitride, the like, or combinations thereof. Other materials are possible. The IMD 152 may then be formed over the etch stop layer 151. The IMD 152 may be a material similar to that described for the first ILD 88 or the second ILD 126, and may be formed in a similar manner. In some embodiments, the IMD 152 may be formed of a low-k dielectric material having a k-value lower than about 3.5. Other materials or techniques are possible. Openings may then be patterned in the IMD 152 and the etch stop layer 151 to expose surfaces of the conductive features 140, 142, and/or 144. An optional liner (not shown) may first be formed in the openings, which may be similar to the liner described previously for the conductive features 140, 142, and 144. A conductive material may be deposited within the openings to form the conductive features 150. The conductive material may be similar to those described for the conductive features 140, 142, and 144, and may be formed in a similar manner. Other conductive materials or techniques are possible. A planarization process may be performed to remove excess conductive material from the IMD 152. FIGS. 27A and 27B show the conductive features 150 as having sloped sidewalls, but the conductive features 150 may have substantially vertical sidewalls, curved sidewalls, or another sidewall profile in other embodiments.

The conductive features 154 may be formed in a similar manner as the conductive features 150. For example, an etch stop layer 153 may be formed over the IMD 152 and conductive features 150, and the IMD 155 may be formed over the IMD 152. The etch stop layer 153 and the IMD 152 may be patterned to form openings. Some of the openings may expose the conductive features 150. A liner and a conductive material may then be deposited in the openings, and a CMP process may be performed to remove excess materials. FIGS. 27A and 27B show the conductive features 154 as having sloped sidewalls, but the conductive features 154 may have substantially vertical sidewalls, curved sidewalls, or another sidewall profile in other embodiments.

Figure 28B:
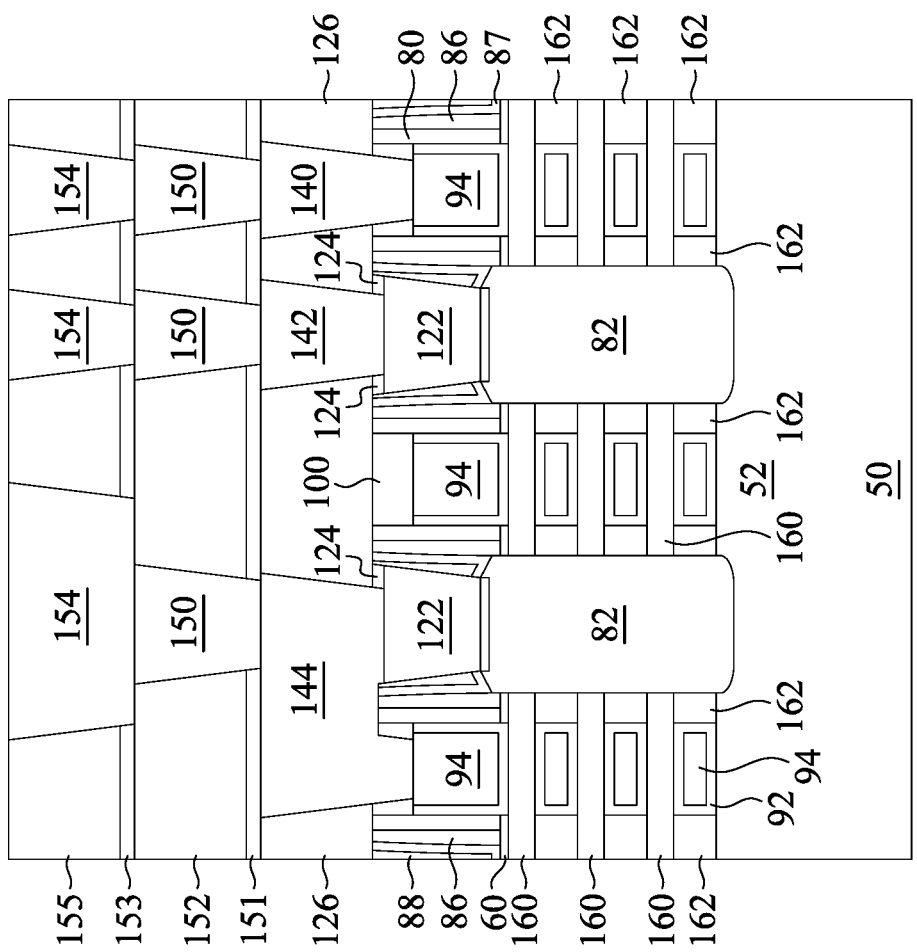
FIGS. 28A and 28B are cross-sectional views of intermediate stages in the manufacturing of Nanostructure Field-Effect Transistor (NSFET) devices, in accordance with some embodiments.
Figure 28A:
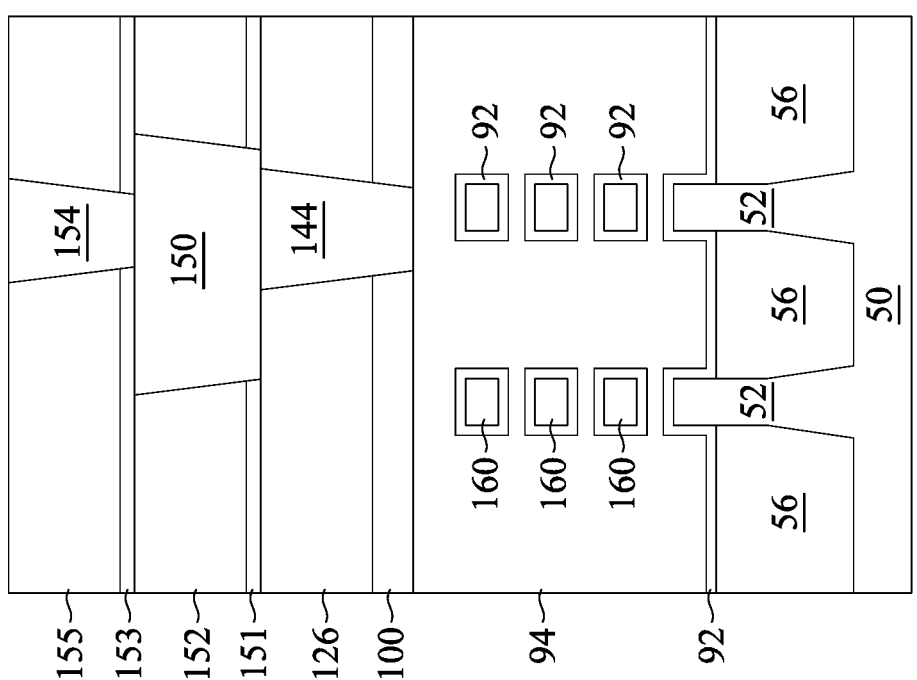

Certain features of the FinFET embodiments discussed herein could also be applied to nanostructure devices such as NFETs/NSFETs. As an example, FIGS. 28A and 28B are cross-sectional views of a NSFET device, in accordance with some embodiments. The NSFET device is similar to the FinFET device shown in FIGS. 27A and 27B. As such, similar features in FIGS. 27A-27B and FIGS. 28A-28B are labeled by similar numerical references. The channel regions of the NSFET device comprise nanostructures 160 separated from the fins 52 and encircled by the respective gate stacks (e.g., the gate dielectric layers 92 and the gate electrodes 94), as shown in FIG. 28A. The nanostructures 160 may comprise nanosheets, nanowires, or the like. The nanostructures 160 and the substrate 50 may comprise a similar semiconductor material or different semiconductor materials. In some embodiments, portions of the gate stacks are interposed between the adjacent nanostructures 160 and spacers 162 are interposed between the portions of the gate stacks and the epitaxial source/drain regions 82, as shown in FIG. 28B. The spacers 162 may act as isolation features between the gate stacks and the epitaxial source/drain regions 82. In some embodiments, the spacers 162 comprise a material such as silicon nitride or silicon oxynitride, although any suitable material, such as a low-k dielectric material, may be utilized. The conductive features 140, 142, and 144 contacting the top surfaces of the gate electrodes and the top surfaces of the conductive features 122 may be formed in a manner similar to the FinFET embodiments discussed previously. In some embodiments, an etch stop layer 124 may be formed on the top surfaces of the conductive features 122, which may be formed in a similar manner and serves a similar purpose as the FinFET embodiments discussed previously.

FIGS. 29A, 29B, and 29C illustrate various top surface profiles of the etch stop layer 124 after the planarization process discussed previously, in accordance with some embodiments. The structure shown in FIGS. 29A, 29B, and 29C is a portion of the structure shown in FIG. 20B, wherein top surfaces of the etch stop layer 124 has different top surface profiles. For example, FIG. 29A illustrates an etch stop layer 124 with a flat top surface, wherein the top surfaces of the etch stop layer 124, the first ILD 88, the CESL 87, the gate spacers 86, gate seal spacers 80, and the dielectric layers 100 may be level. In some cases, forming the etch stop layer 124 with a flat top surface or forming the etch stop layer 124 with uniform thickness leads to a better controlled etch process when the etch stop layer 124 is etched through, thereby results in a better profile of the conductive feature 142, as shown in FIG. 26B. FIG. 29B illustrates an etch stop layer 124 with a convex or protruding top surface such that the top surface of the etch stop layer 124 extends above the top surfaces of the etch stop layers 124, the first ILD 88, the CESL 87, the gate spacers 86, gate seal spacers 80, and/or the dielectric layers 100. FIG. 29C illustrates an etch stop layer 124 with a concave or dishing top surface such that the top surface of the etch stop layer 124 extends below the top surfaces of the etch stop layers 124, the first ILD 88, the CESL 87, the gate spacers 86, gate seal spacers 80, and the dielectric layers 100.

In some embodiments, top surface profile of the etch stop layer 124 may be controlled by controlling the polishing rate of the etch stop layer 124 (R1) and the polishing rate of the surrounding layers (R2), such as the first ILD 88, the CESL 87, the gate spacers 86, gate seal spacers 80, and/or the dielectric layers 100. In some embodiments, R1 is the same as R2, the planarization process may result in the etch stop layer 124 with a flat top surface, such as illustrated in FIG. 29A. In some embodiments, R1 is smaller than R2, the planarization process may result in the etch stop layer 124 with a convex or protruding top surface, such as illustrated in FIG. 29B. In some embodiments, R1 is greater than R2, the planarization process may result in the etch stop layer 124 with a concave or dishing top surface, such as illustrated in FIG. 29C.

Figure 30A:
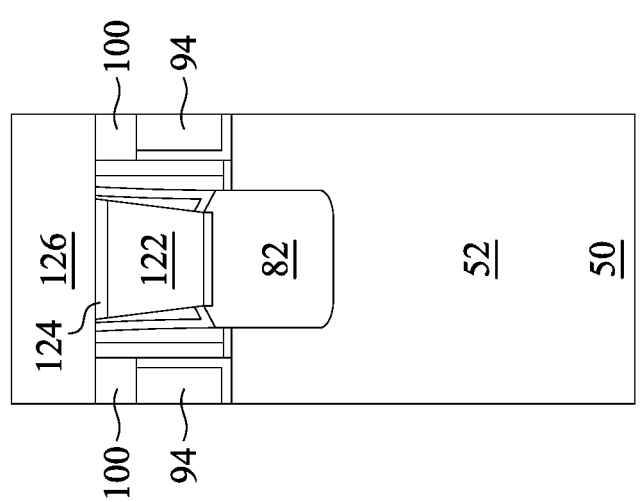
Figure 30B:
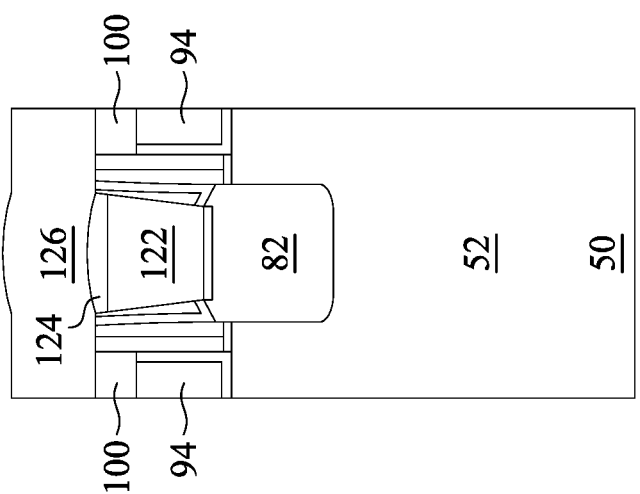
Figure 30C:
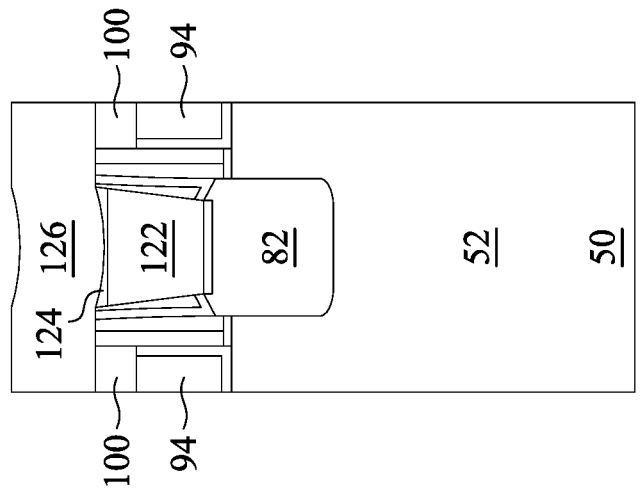

FIGS. 30A, 30B, and 30C show the second ILD 126 formed on the etch stop layers 124 of FIGS. 29A, 29B, and 29C, in accordance with some embodiments. The structure shown in FIGS. 30A, 30B, and 30C is a portion of the structure shown in FIG. 21B, wherein an upper surface of the second ILD 126 corresponds to an upper surface of the underlying etch stop layer 124. FIG. 30A shows a second ILD 126 formed on the flat top surface of the etch stop layer 124 of FIG. 29A, in accordance with some embodiments. The second ILD 126 may be with a flat top surface and a flat bottom surface. FIG. 30B shows a second ILD 126 formed on the convex or protruding top surface of the etch stop layer 124 of FIG. 29B, in accordance with some embodiments. The portion of the top surface of the second ILD 126 over the etch stop layer 124 may be convex or protruding and the portion of the bottom surface of the second ILD 126 over the etch stop layer 124 may be concave or dishing. FIG. 30C shows a second ILD 126 formed on the concave or dishing top surface of the etch stop layer 124 of FIG. 29C, in accordance with some embodiments. The portion of the top surface of the second ILD 126 over the etch stop layer 124 may be concave or dishing and the portion of the bottom surface of the second ILD 126 over the etch stop layer 124 may be convex or protruding.

Figure 31A:
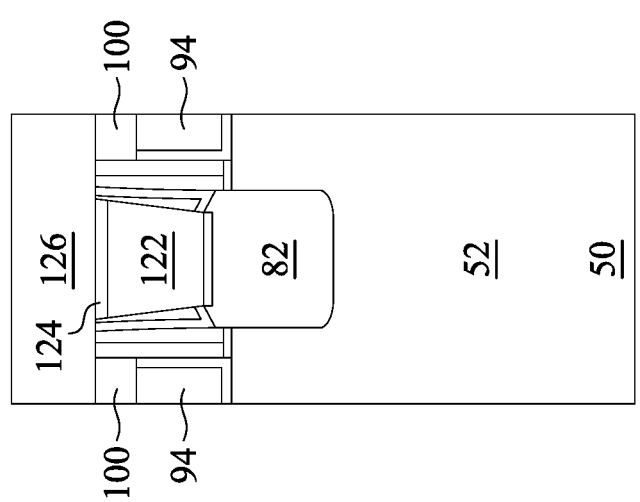
Figure 31B:
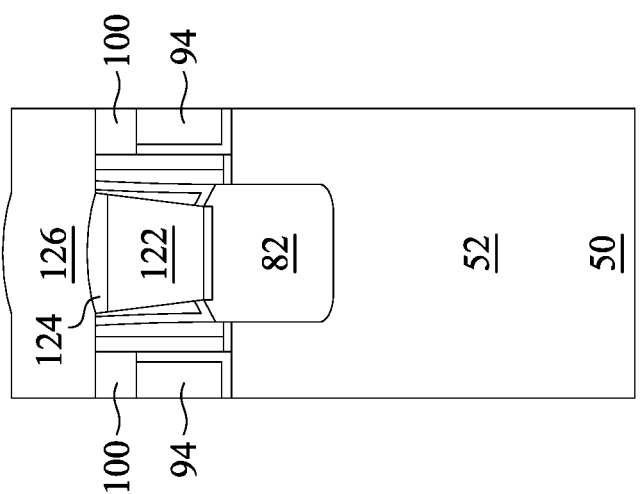
Figure 31C:
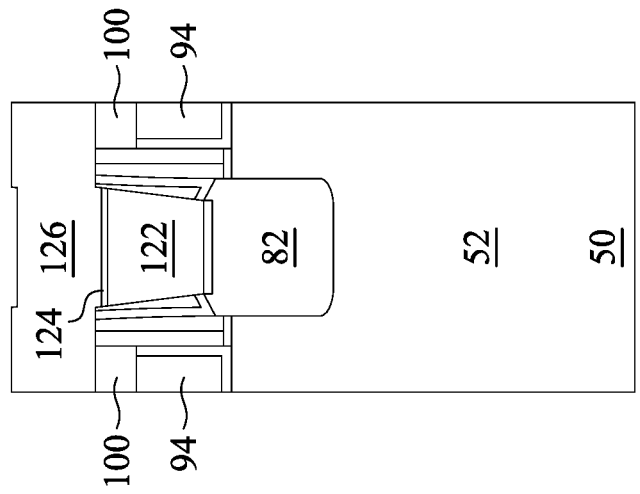

FIGS. 31A, 31B, and 31C illustrate various examples of shapes of the etch stop layer 124 after the annealing process, which is performed after the deposition of the second ILD 126 as discussed previously. FIGS. 31A, 31B, and 31C may represent the shape of the etch stop layer 124 as illustrated in, for example, FIG. 30A after the annealing process. In some embodiments, as shown in FIG. 31A, the etch stop layer 124 and the second ILD 126 may both retain the flat top surface after the annealing process. In some cases, forming the etch stop layer 124 with a flat top surface or forming the etch stop layer 124 with uniform thickness leads to a better controlled etch process when the etch stop layer 124 is etched through, thereby results in a better profile of the conductive feature 142, as shown in FIG. 26B.

In some embodiments, as shown in FIG. 31B, the etch stop layer 124 may have a convex or protruding top surface after the annealing process. For example, the process of forming and/or annealing the second ILD 126 may use a higher temperature, such as in a range of 400° C. to about 500° C., and these higher temperatures may cause the etch stop layer 124 to expand due to the reduction of surface energy on the top surface of the etch stop layer 124. As a result, a portion of the top surface of the second ILD 126 over the etch stop layer 124 may be convex or protruding and the portion of the bottom surface of the second ILD 126 over the etch stop layer 124 may be concave or dishing. In other words, the portion of the bottom surface of the second ILD 126 over the etch stop layer 124 may extend above the top surfaces of the etch stop layers 124, the first ILD 88, the CESL 87, the gate spacers 86, gate seal spacers 80, and the dielectric layers 100.

In some embodiments, as shown in FIG. 31C, the etch stop layer 124 may have recessed or sunken surface after the annealing process. This may be due to the shrinking the conductive feature 122 underneath caused by metal grain growth or micro-void/impurity removal during the annealing process and/or a result of dishing during the planarization process described above. As a result, the portion of the top surface of the second ILD 126 over the etch stop layer 124 may be recessed and the portion of the bottom surface of the second ILD 126 over the etch stop layer 124 may be protruding. In other words, a portion of the bottom surface of the second ILD 126 over the etch stop layer 124 may remain flat and extend below the top surfaces of the etch stop layers 124, the first ILD 88, the CESL 87, the gate spacers 86, gate seal spacers 80, and the dielectric layers 100.

Figure 32A:
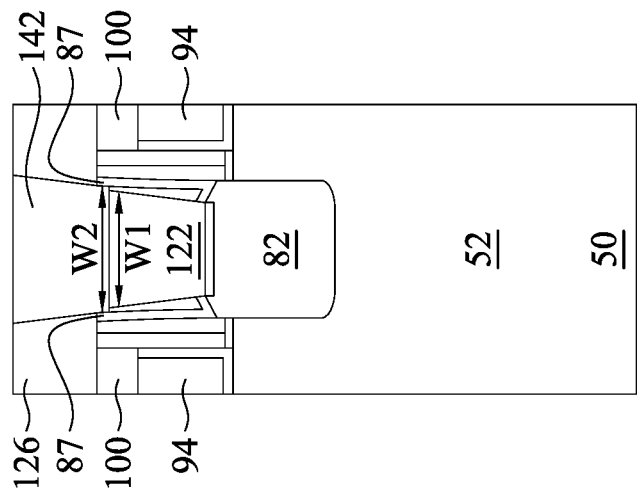
Figure 32B:
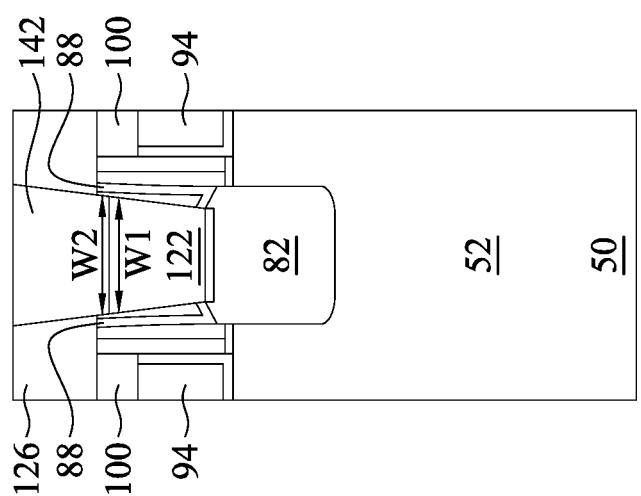
Figure 32C:
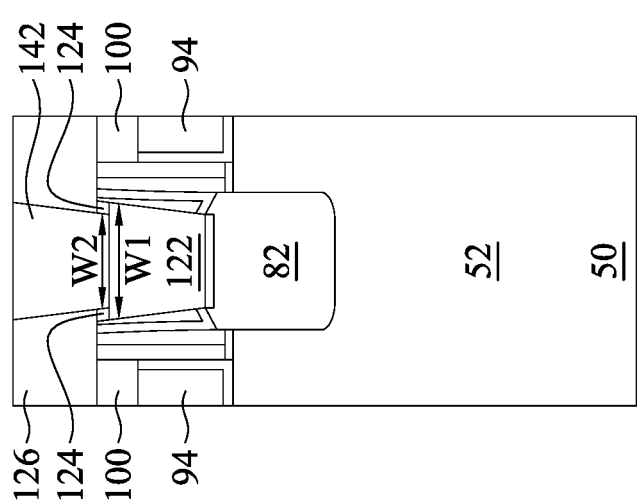

FIGS. 32A, 32B, and 32C illustrate a structure similar to that shown in FIG. 26B, wherein the conductive features 142 have different widths. The width of the top surface of the conductive feature 122 is labeled "W1" and the width of the bottom surface of the conductive feature 142 is labeled "W2." FIG. 32A illustrates a conductive feature 142 having a width W2 that is smaller than the width W1 of a conductive feature 122, in accordance with some embodiments. As shown in FIG. 32A, forming a conductive feature 142 having a width W2 less than width W1 may result in portions of the etch stop layer 124 remaining on the conductive feature 122 after formation of the conductive feature 142. In some embodiments, one or both opposing sidewalls of conductive feature 142 may be in physical contact with sidewalls of the etch stop layer 124. For example, in some embodiments, the bottom portion of the conductive feature 142 may be at least partially encircled by portions of the etch stop layer 124. In some cases, forming a conductive feature 142 with a relatively smaller W2 may reduce the risk of via-via leakage, via bridging defects, "tiger-tooth" defects, defects resulting from photolithography overlay issues, or the like.

FIG. 32B illustrates a conductive feature 142 having a width W2 that is approximately the same as the width W1 of a conductive feature 122, in accordance with some embodiments. As shown in FIG. 32B, forming a conductive feature 142 having a width W2 approximately the same as the width W1 may result in the removal of the etch stop layer 124 in a cross-sectional view. In some embodiments, the conductive feature 142 may be in physical contact with top portions of sidewalls of the first ILD 88. In some embodiments, the bottom portion of the conductive feature 142 may be at least partially encircled by top portions of the first ILD 88. In some cases, forming a conductive feature 142 having a width W2 approximately the same as the width W1 can increase the contact area between the conductive feature 122 and the conductive feature 142. Increasing the contact area in this manner can reduce contact resistance between the conductive feature 122 and the conductive feature 142 and improve device performance.

FIG. 32C illustrates a conductive feature 142 having a width W2 that is larger than the width W1 of a conductive feature 122, in accordance with some embodiments. As shown in FIG. 32C, forming a conductive feature 142 having a width W2 that is larger than the width W1 may result in the removal of the etch stop layer 124 in a cross-sectional view. In some embodiments, the conductive feature 142 may be in physical contact with top portions of sidewalls of the CESL 87. In some embodiments, the bottom portion of the conductive feature 142 may be at least partially encircled by top portions of the CESL 87.

The embodiments described here have some advantages. For example, an etch stop layer may be formed within a recess of the conductive feature connected to the source/drain region instead of depositing a blanket etch stop layer over the source/drain region and the gate stack. This reduces the overall thickness of the device, including the thickness of layers over the gate stack, thereby results in a better controlled etch process when forming the conductive feature over the gate stack, which leads to a better profile of the conductive feature. This way, electrical connection in the device is improved.

In an embodiment, a semiconductor device includes a source/drain region on a substrate; a first conductive feature over the source/drain region; a first etch stop layer over the first conductive feature; a gate structure on the substrate; a second etch stop layer over the gate structure, wherein the first etch stop layer and the second etch stop layer have different thicknesses; a first dielectric layer adjacent to the first conductive feature, the first etch stop layer, the gate structure, and the second etch stop layer; a second dielectric layer over the first dielectric layer; a source/drain contact extending through the second dielectric layer and the first etch stop layer to the first conductive feature; and a gate contact extending through the second dielectric layer and the second etch stop layer to the gate structure. In an embodiment, the first etch stop layer and the second etch stop layer are formed of different materials. In an embodiment, a thickness of the first etch stop layer is in a range between 1 nm and 10 nm. In an embodiment, a thickness of the second etch stop layer is in a range between 10 nm and 20 nm. In an embodiment, a thickness of the first etch stop layer is less than a thickness of the second etch stop layer. In an embodiment, the first dielectric layer extends between the first etch stop layer and the second etch stop layer. In an embodiment, a top surface of the first etch stop layer and a top surface of the first dielectric layer are level. In an embodiment, a gate spacer extends along a sidewall of the gate structure, and wherein a top surface of the first etch stop layer is level with a top surface of the gate spacer.

In an embodiment, a semiconductor device includes a source/drain region on a substrate; a first conductive feature over the source/drain region; a first etch stop layer over the first conductive feature, the first etch stop layer comprising a first material; a gate structure on the substrate; a second etch stop layer over the gate structure, the second etch stop layer comprising a second material, wherein the first material and the second material are different materials; a first dielectric layer between the first etch stop layer and the second etch stop layer; a second dielectric layer over the first dielectric layer; a source/drain contact extending through the second dielectric layer and the first etch stop layer to the first conductive feature; and a gate contact extending through the second dielectric layer and the second etch stop layer to the gate structure. In an embodiment, the first etch stop layer comprises aluminum oxide, aluminum nitride, tungsten nitride, molybdenum oxide, molybdenum nitride, boron nitride, or a combination thereof. In an embodiment, the first conductive feature comprises cobalt, tungsten, ruthenium, copper, or a combination thereof. In an embodiment, the second etch stop layer comprises silicon nitride, silicon carbide, silicon carbonitride, or a combination thereof. In an embodiment, a top surface of the first etch stop layer extends above a top surface of the first dielectric layer. In an embodiment, a top surface of the first etch stop layer extends below a top surface of the first dielectric layer.

In an embodiment, a method of forming a semiconductor device includes forming a gate structure on a substrate; forming a source/drain region adjacent to the gate structure; forming a first dielectric layer on the source/drain region; forming a contact plug extending through the first dielectric layer to contact the source/drain region; forming a dielectric helmet on the contact plug, wherein a top surface of the dielectric helmet is level with a top surface of the first dielectric layer; forming a second dielectric layer on the dielectric helmet and the gate structure; and forming a conductive feature through the second dielectric layer to the contact plug. In an embodiment, forming the conductive includes performing a first etch process to create an opening in the second dielectric layer, wherein the dielectric helmet is used as an etch stop layer during the first etch process; and performing a second etch process to remove portions of the dielectric helmet to expose the contact plug. In an embodiment, the conductive feature is in physical contact with sidewalls of the dielectric helmet. In an embodiment, the conductive feature is in physical contact with sidewalls of the first dielectric layer. In an embodiment, the conductive feature is electrically connected with the gate structure and the source/drain region. In an embodiment, a gate spacer extends along a sidewall of the gate structure, and wherein the top surface of the dielectric helmet is level with a top surface of the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a source/drain region on a substrate;
a first conductive feature over the source/drain region;
a first etch stop layer over the first conductive feature;
a gate structure on the substrate;
a second etch stop layer over the gate structure, wherein the first etch stop layer and the second etch stop layer have different thicknesses;
a first dielectric layer adjacent to the first conductive feature, the first etch stop layer, the gate structure, and the second etch stop layer, wherein the first etch stop layer and the second etch stop layer are separated by the first dielectric layer;
a second dielectric layer over the first dielectric layer;
a source/drain contact extending through the second dielectric layer and the first etch stop layer to the first conductive feature; and
a gate contact extending through the second dielectric layer and the second etch stop layer to the gate structure.

2. The semiconductor device of claim 1, wherein the first etch stop layer and the second etch stop layer are formed of different materials.

3. The semiconductor device of claim 1, wherein a thickness of the first etch stop layer is in a range between 1 nm and 10 nm.

4. The semiconductor device of claim 1, wherein a thickness of the second etch stop layer is in a range between 10 nm and 20 nm.

5. The semiconductor device of claim 1, wherein a thickness of the first etch stop layer is less than a thickness of the second etch stop layer.

6. The semiconductor device of claim 1, wherein a top surface of the first etch stop layer is level with a top surface of the first dielectric layer.

7. The semiconductor device of claim 1, wherein a gate spacer extends along a sidewall of the gate structure, and wherein a top surface of the first etch stop layer is level with a top surface of the gate spacer.

8. The semiconductor device of claim 1, wherein a top surface of the second etch stop layer is level with a top surface of the first dielectric layer.

9. A semiconductor device comprising:
a source/drain region on a substrate;
a first conductive feature over the source/drain region;
a first etch stop layer over the first conductive feature, the first etch stop layer comprising a first material;
a gate structure on the substrate;
a second etch stop layer over the gate structure, the second etch stop layer comprising a second material, wherein the first material and the second material are different materials;

a first dielectric layer between the first etch stop layer and the second etch stop layer, wherein a top surface of the first dielectric layer is level with top surfaces of the first etch stop layer and the second etch stop layer;

a second dielectric layer over the first dielectric layer;

a source/drain contact extending through the second dielectric layer and the first etch stop layer to the first conductive feature; and a gate contact extending through the second dielectric layer and the second etch stop layer to the gate structure.

10. The semiconductor device of claim 9, wherein the first etch stop layer comprises aluminum oxide, aluminum nitride, tungsten nitride, molybdenum oxide, molybdenum nitride, boron nitride, or a combination thereof.

11. The semiconductor device of claim 9, wherein the first conductive feature comprises cobalt, tungsten, ruthenium, copper, or a combination thereof.

12. The semiconductor device of claim 9, wherein the second etch stop layer comprises silicon nitride, silicon carbide, silicon carbonitride, or a combination thereof.

13. The semiconductor device of claim 9, wherein the second etch stop layer has a larger thickness than the first etch stop layer.

14. The semiconductor device of claim 9, wherein the first etch stop layer and the second etch stop layer are separated by the first dielectric layer.

15. A semiconductor device comprising:
a source/drain region;
a first conductive feature over the source/drain region;
a first etch stop layer over the first conductive feature;
a first dielectric layer on sidewalls of the first conductive feature and outer sidewalls of the first etch stop layer, wherein a top surface of the first etch stop layer is level with a top surface of the first dielectric layer;

a second dielectric layer over the first etch stop layer and the first dielectric layer; and a source/drain contact extending through the second dielectric layer and the first etch stop layer to contact the first conductive feature, wherein the source/drain contact is in contact with inner sidewalls of the first etch stop layer.

16. The semiconductor device of claim 15, further comprising:
a gate structure beside the source/drain region;
a gate spacer extending on a sidewall of the gate structure; and
a second etch stop layer over the gate structure, wherein the first etch stop layer and the second etch stop layer comprise different materials.

17. The semiconductor device of claim 16, wherein the second etch stop layer has a larger thickness than the first etch stop layer.

18. The semiconductor device of claim 16, wherein the top surface of the first etch stop layer is level with a top surface of the second etch stop layer.

19. The semiconductor device of claim 16, wherein the top surface of the first etch stop layer is level with a top surface of the gate spacer.

20. The semiconductor device of claim 16, wherein the first etch stop layer and the second etch stop layer are separated by the gate spacer.

* * * * *